United States Patent
Zhang

(10) Patent No.: US 9,595,618 B2
(45) Date of Patent: Mar. 14, 2017

(54) SEMICONDUCTOR DEVICES WITH HETEROJUNCTION BARRIER REGIONS AND METHODS OF FABRICATING SAME

(71) Applicant: Cree, Inc., Durham, NC (US)

(72) Inventor: Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/499,390

(22) Filed: Sep. 29, 2014

(65) Prior Publication Data

US 2015/0076522 A1 Mar. 19, 2015

Related U.S. Application Data

(63) Continuation of application No. 12/719,412, filed on Mar. 8, 2010, now Pat. No. 9,117,739.

(51) Int. Cl.
| | |
|---|---|
| *H01L 29/872* | (2006.01) |
| *H01L 29/16* | (2006.01) |
| *H01L 29/165* | (2006.01) |
| *H01L 29/47* | (2006.01) |
| *H01L 29/66* | (2006.01) |
| *H01L 29/861* | (2006.01) |
| *H01L 29/06* | (2006.01) |

(52) U.S. Cl.
CPC ........ *H01L 29/872* (2013.01); *H01L 29/0619* (2013.01); *H01L 29/165* (2013.01); *H01L 29/1608* (2013.01); *H01L 29/47* (2013.01); *H01L 29/66068* (2013.01); *H01L 29/861* (2013.01)

(58) Field of Classification Search
CPC .. H01L 29/861; H01L 29/872; H01L 29/6606
See application file for complete search history.

(56) References Cited

U.S. PATENT DOCUMENTS

| | | |
|---|---|---|
| 3,439,189 A | 4/1969 | Petry |
| 3,629,011 A | 12/1971 | Tohi et al. |
| 3,924,024 A | 12/1975 | Naber et al. |
| 4,160,920 A | 7/1979 | Courier de Méré |

(Continued)

FOREIGN PATENT DOCUMENTS

| | | |
|---|---|---|
| CN | 1259228 A | 7/2000 |
| DE | 3942640 A1 | 8/1990 |

(Continued)

OTHER PUBLICATIONS

Afanasev, V. et al., "Intrinsic SiC/SiO2 Interface States", Phys. Stat. Sol., Received Jan. 31, 1997, vol. 162, pp. 321-337.

(Continued)

*Primary Examiner* — William F Kraig
*Assistant Examiner* — Sun M Kim
(74) *Attorney, Agent, or Firm* — Anthony J. Josephson

(57) ABSTRACT

An electronic device includes a silicon carbide layer including an n-type drift region therein, a contact forming a junction, such as a Schottky junction, with the drift region, and a p-type junction barrier region on the silicon carbide layer. The p-type junction barrier region includes a p-type polysilicon region forming a P-N heterojunction with the drift region, and the p-type junction barrier region is electrically connected to the contact. Related methods are also disclosed.

8 Claims, 8 Drawing Sheets

(56) References Cited

U.S. PATENT DOCUMENTS

| | | |
|---|---|---|
| 4,242,690 A | 12/1980 | Temple |
| 4,466,172 A | 8/1984 | Batra |
| 4,570,328 A | 2/1986 | Price et al. |
| 4,581,542 A | 4/1986 | Steigerwald |
| 4,641,174 A | 2/1987 | Baliga |
| 4,644,637 A | 2/1987 | Temple |
| 4,811,065 A | 3/1989 | Cogan |
| 4,827,322 A | 5/1989 | Takata |
| 4,875,083 A | 10/1989 | Palmour |
| 4,927,772 A | 5/1990 | Arthur et al. |
| 4,945,394 A | 7/1990 | Palmour et al. |
| 4,946,547 A | 8/1990 | Palmour et al. |
| 5,011,549 A | 4/1991 | Kong et al. |
| 5,017,976 A | 5/1991 | Sugita |
| 5,028,977 A | 7/1991 | Kenneth et al. |
| 5,032,888 A | 7/1991 | Seki |
| 5,041,881 A | 8/1991 | Bishop et al. |
| 5,111,253 A | 5/1992 | Korman et al. |
| 5,155,289 A | 10/1992 | Bowles |
| 5,166,760 A | 11/1992 | Mori et al. |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,262,669 A | 11/1993 | Wakatabe et al. |
| 5,270,554 A | 12/1993 | Palmour |
| 5,292,501 A | 3/1994 | Degenhardt et al. |
| 5,296,395 A | 3/1994 | Khan et al. |
| 5,342,803 A | 8/1994 | Shimoji |
| 5,345,100 A | 9/1994 | Kan et al. |
| 5,348,895 A | 9/1994 | Smayling et al. |
| 5,371,383 A | 12/1994 | Miyata et al. |
| 5,384,270 A | 1/1995 | Ueno |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A | 3/1995 | Baliga |
| 5,399,887 A | 3/1995 | Weitzel et al. |
| 5,459,107 A | 10/1995 | Palmour |
| 5,468,654 A | 11/1995 | Harada |
| 5,473,176 A | 12/1995 | Kakumoto |
| 5,479,316 A | 12/1995 | Smrtic et al. |
| 5,488,236 A | 1/1996 | Baliga et al. |
| 5,506,421 A | 4/1996 | Palmour |
| 5,510,281 A | 4/1996 | Ghezzo et al. |
| 5,510,630 A | 4/1996 | Agarwal et al. |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,612,567 A | 3/1997 | Baliga |
| 5,629,531 A | 5/1997 | Palmour |
| 5,710,059 A | 1/1998 | Rottner |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,753,960 A | 5/1998 | Dickmann |
| 5,763,905 A | 6/1998 | Harris |
| 5,767,540 A | 6/1998 | Shimizu |
| 5,776,837 A | 7/1998 | Palmour |
| 5,804,483 A | 9/1998 | Harris |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller |
| 5,877,045 A | 3/1999 | Kapoor |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A | 10/1999 | Singh |
| 5,972,801 A | 10/1999 | Lipkin et al. |
| 5,977,605 A | 11/1999 | Bakowsky et al. |
| 6,020,600 A | 2/2000 | Miyajima et al. |
| 6,025,233 A | 2/2000 | Terasawa |
| 6,025,608 A | 2/2000 | Harris et al. |
| 6,028,012 A | 2/2000 | Wang |
| 6,040,237 A | 3/2000 | Bakowski et al. |
| 6,048,766 A | 4/2000 | Gardner et al. |
| 6,054,728 A | 4/2000 | Harada et al. |
| 6,057,352 A | 5/2000 | Brown et al. |
| 6,063,698 A | 5/2000 | Tseng et al. |
| 6,078,090 A | 6/2000 | Williams et al. |
| 6,083,814 A | 7/2000 | Nilsson |
| 6,096,607 A | 8/2000 | Ueno |
| 6,097,046 A | 8/2000 | Plumton |
| 6,100,169 A | 8/2000 | Suvorov et al. |
| 6,104,043 A | 8/2000 | Hermansson et al. |
| 6,107,142 A | 8/2000 | Suvorov et al. |
| 6,117,735 A | 9/2000 | Ueno |
| 6,121,633 A | 9/2000 | Singh et al. |
| 6,133,587 A | 10/2000 | Takeuchi et al. |
| 6,136,727 A | 10/2000 | Ueno |
| 6,136,728 A | 10/2000 | Wang |
| 6,165,822 A | 12/2000 | Okuno et al. |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,680 B1 | 4/2001 | Carter, Jr. et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,246,076 B1 | 6/2001 | Lipkin et al. |
| 6,252,288 B1 | 6/2001 | Chang |
| 6,297,100 B1 | 10/2001 | Kumar et al. |
| 6,297,172 B1 | 10/2001 | Kashiwagi |
| 6,303,508 B1 | 10/2001 | Alok |
| 6,316,791 B1 | 11/2001 | Schörner et al. |
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,501,145 B1 | 12/2002 | Kaminski et al. |
| 6,515,303 B2 | 2/2003 | Ring |
| 6,524,900 B2 | 2/2003 | Dahlqvist et al. |
| 6,548,333 B2 | 4/2003 | Smith |
| 6,551,865 B2 | 4/2003 | Kumar et al. |
| 6,573,534 B1 | 6/2003 | Kumar et al. |
| 6,593,620 B1 | 7/2003 | Hshieh et al. |
| 6,610,366 B2 | 8/2003 | Lipkin |
| 6,627,539 B1 | 9/2003 | Zhao et al. |
| 6,649,497 B2 | 11/2003 | Ring |
| 6,649,995 B2 | 11/2003 | Tooi et al. |
| 6,653,659 B2 | 11/2003 | Ryu et al. |
| 6,696,705 B1 | 2/2004 | Barthelmess et al. |
| 6,703,642 B1 | 3/2004 | Shah |
| 6,743,703 B2 | 6/2004 | Rodov et al. |
| 6,767,843 B2 | 7/2004 | Lipkin et al. |
| 6,861,723 B2 | 3/2005 | Willmeroth |
| 6,936,850 B2 | 8/2005 | Friedrichs et al. |
| 6,946,739 B2 | 9/2005 | Ring |
| 6,949,401 B2 | 9/2005 | Kaminski et al. |
| 6,956,238 B2 | 10/2005 | Ryu et al. |
| 6,976,936 B2 | 12/2005 | Yamaoka et al. |
| 6,979,863 B2 | 12/2005 | Ryu |
| 7,026,650 B2 | 4/2006 | Ryu et al. |
| 7,074,643 B2 | 7/2006 | Ryu |

(56) References Cited

U.S. PATENT DOCUMENTS

| | | |
|---|---|---|
| 7,118,970 B2 | 10/2006 | Das et al. |
| 7,125,786 B2 | 10/2006 | Ring et al. |
| 7,183,575 B2 | 2/2007 | Shimoida et al. |
| 7,186,609 B2 * | 3/2007 | Korec et al. ............... 438/221 |
| 7,221,010 B2 | 5/2007 | Ryu |
| 7,253,031 B2 | 8/2007 | Takahashi et al. |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,528,040 B2 | 5/2009 | Das et al. |
| 7,544,963 B2 | 6/2009 | Saxler |
| 7,547,578 B2 | 6/2009 | Agarwal et al. |
| 7,548,112 B2 | 6/2009 | Sheppard |
| 7,605,441 B2 | 10/2009 | Nakazawa et al. |
| 7,649,213 B2 | 1/2010 | Hatakeyama et al. |
| 7,687,825 B2 | 3/2010 | Zhang |
| 7,728,402 B2 | 6/2010 | Zhang et al. |
| 7,781,786 B2 | 8/2010 | Hayashi et al. |
| 7,851,881 B1 | 12/2010 | Zhao et al. |
| 7,851,882 B2 * | 12/2010 | Okuno et al. ............... 257/472 |
| 7,893,467 B2 | 2/2011 | Yamamoto et al. |
| 7,902,054 B2 | 3/2011 | Tsuchida et al. |
| 7,994,033 B2 | 8/2011 | Yoshii |
| 8,168,582 B2 | 5/2012 | Blanco et al. |
| 8,232,558 B2 | 7/2012 | Zhang et al. |
| 8,372,738 B2 | 2/2013 | Zhu |
| 8,618,582 B2 | 12/2013 | Henning et al. |
| 8,653,534 B2 | 2/2014 | Zhang et al. |
| 8,680,587 B2 * | 3/2014 | Henning et al. ............... 257/267 |
| 2001/0055852 A1 | 12/2001 | Moise et al. |
| 2002/0030191 A1 | 3/2002 | Das et al. |
| 2002/0038891 A1 | 4/2002 | Ryu et al. |
| 2002/0047125 A1 | 4/2002 | Fukuda et al. |
| 2002/0072247 A1 | 6/2002 | Lipkin et al. |
| 2002/0102358 A1 | 8/2002 | Das et al. |
| 2002/0121641 A1 | 9/2002 | Alok et al. |
| 2002/0125482 A1 | 9/2002 | Friedrichs et al. |
| 2002/0125541 A1 | 9/2002 | Korec et al. |
| 2003/0025175 A1 | 2/2003 | Asano et al. |
| 2003/0057482 A1 | 3/2003 | Harada |
| 2003/0107041 A1 | 6/2003 | Tanimoto et al. |
| 2003/0137010 A1 | 7/2003 | Friedrichs et al. |
| 2003/0178672 A1 | 9/2003 | Hatakeyama et al. |
| 2003/0201455 A1 | 10/2003 | Takahashi et al. |
| 2004/0016929 A1 | 1/2004 | Nakatsuka et al. |
| 2004/0031971 A1 * | 2/2004 | Shimoida et al. ............ 257/199 |
| 2004/0079989 A1 | 4/2004 | Kaneko et al. |
| 2004/0082116 A1 | 4/2004 | Kub et al. |
| 2004/0173801 A1 | 9/2004 | Willmeroth |
| 2004/0183079 A1 | 9/2004 | Kaneko et al. |
| 2004/0211980 A1 | 10/2004 | Ryu |
| 2004/0212011 A1 | 10/2004 | Ryu |
| 2004/0256659 A1 | 12/2004 | Kim et al. |
| 2004/0259339 A1 | 12/2004 | Tanabe et al. |
| 2005/0001268 A1 | 1/2005 | Baliga |
| 2005/0012143 A1 | 1/2005 | Tanaka et al. |
| 2005/0062124 A1 | 3/2005 | Chiola |
| 2005/0104072 A1 | 5/2005 | Slater, Jr. et al. |
| 2005/0139936 A1 | 6/2005 | Li |
| 2005/0151138 A1 | 7/2005 | Slater, Jr. et al. |
| 2005/0181536 A1 | 8/2005 | Tsuji |
| 2005/0224838 A1 | 10/2005 | Tanaka et al. |
| 2005/0245034 A1 | 11/2005 | Fukuda et al. |
| 2005/0275055 A1 | 12/2005 | Parthasarathy et al. |
| 2006/0011128 A1 | 1/2006 | Ellison et al. |
| 2006/0060884 A1 | 3/2006 | Ohyanagi et al. |
| 2006/0065899 A1 * | 3/2006 | Hatakeyama ......... H01L 29/045 257/77 |
| 2006/0086997 A1 | 4/2006 | Kanaya et al. |
| 2006/0211210 A1 | 9/2006 | Bhat et al. |
| 2006/0214242 A1 | 9/2006 | Carta et al. |
| 2006/0244006 A1 | 11/2006 | Fujihira et al. |
| 2006/0244010 A1 | 11/2006 | Saxler |
| 2006/0255423 A1 | 11/2006 | Ryu et al. |
| 2006/0261347 A1 | 11/2006 | Ryu et al. |
| 2006/0261876 A1 | 11/2006 | Agarwal et al. |
| 2006/0267021 A1 | 11/2006 | Rowland et al. |
| 2007/0023781 A1 | 2/2007 | Mizukami et al. |
| 2007/0066039 A1 | 3/2007 | Agarwal et al. |
| 2007/0120148 A1 | 5/2007 | Nogome |
| 2007/0164321 A1 | 7/2007 | Sheppard et al. |
| 2007/0205122 A1 | 9/2007 | Oda et al. |
| 2007/0228505 A1 * | 10/2007 | Mazzola ............... H01L 29/872 257/471 |
| 2007/0235745 A1 | 10/2007 | Hayashi et al. |
| 2007/0241427 A1 | 10/2007 | Mochizuki et al. |
| 2007/0278609 A1 | 12/2007 | Harris et al. |
| 2008/0001158 A1 | 1/2008 | Das et al. |
| 2008/0003731 A1 | 1/2008 | Mazzola et al. |
| 2008/0006848 A1 | 1/2008 | Chen et al. |
| 2008/0029838 A1 | 2/2008 | Zhang et al. |
| 2008/0105949 A1 | 5/2008 | Zhang et al. |
| 2008/0169475 A1 | 7/2008 | Nishio et al. |
| 2008/0191304 A1 | 8/2008 | Zhang et al. |
| 2008/0197439 A1 | 8/2008 | Goerlach et al. |
| 2008/0230787 A1 | 9/2008 | Suzuki et al. |
| 2008/0246085 A1 | 10/2008 | Saito et al. |
| 2008/0251793 A1 | 10/2008 | Mazzola et al. |
| 2008/0277669 A1 | 11/2008 | Okuno et al. |
| 2008/0296587 A1 | 12/2008 | Yamamoto et al. |
| 2008/0296771 A1 | 12/2008 | Das et al. |
| 2009/0008651 A1 | 1/2009 | Okuno et al. |
| 2009/0085064 A1 | 4/2009 | Rueb et al. |
| 2009/0121319 A1 | 5/2009 | Zhang et al. |
| 2009/0146154 A1 | 6/2009 | Zhang et al. |
| 2009/0212301 A1 | 8/2009 | Zhang et al. |
| 2009/0267141 A1 | 10/2009 | Matocha et al. |
| 2009/0267200 A1 | 10/2009 | Gutt et al. |
| 2009/0272983 A1 | 11/2009 | Kumar et al. |
| 2009/0289262 A1 | 11/2009 | Zhang et al. |
| 2010/0032685 A1 | 2/2010 | Zhang et al. |
| 2010/0133549 A1 | 6/2010 | Zhang et al. |
| 2010/0133550 A1 | 6/2010 | Zhang et al. |
| 2010/0140628 A1 | 6/2010 | Zhang |
| 2010/0240202 A1 | 9/2010 | Yoshii |
| 2010/0244047 A1 | 9/2010 | Hull et al. |
| 2010/0258897 A1 | 10/2010 | Lui et al. |
| 2010/0277839 A1 | 11/2010 | Nicholson et al. |
| 2011/0001209 A1 | 1/2011 | Watanabe et al. |
| 2011/0095301 A1 | 4/2011 | Tarui |
| 2011/0204435 A1 | 8/2011 | Disney |
| 2011/0207321 A1 | 8/2011 | Fujiwara et al. |
| 2011/0215338 A1 | 9/2011 | Zhang |
| 2013/0268880 A1 | 10/2013 | Kasravi et al. |
| 2014/0290736 A1 | 10/2014 | Weigel et al. |

FOREIGN PATENT DOCUMENTS

| | | |
|---|---|---|
| DE | 4210402 A1 | 10/1992 |
| DE | 29504629 U1 | 6/1995 |
| DE | 19633183 A1 | 2/1998 |
| DE | 19633184 A7 | 2/1998 |
| DE | 19723176 C1 | 8/1998 |
| DE | 19809554 A1 | 9/1998 |
| DE | 19900171 A1 | 7/1999 |
| DE | 10036208 A1 | 2/2002 |
| EP | 0176778 A2 | 4/1986 |
| EP | 0192229 A2 | 8/1986 |
| EP | 0269294 A1 | 6/1988 |
| EP | 0380340 A2 | 8/1990 |
| EP | 0389863 A1 | 10/1990 |
| EP | 0735591 A1 | 10/1996 |
| EP | 0837508 A2 | 4/1998 |
| EP | 0865085 A1 | 9/1998 |
| EP | 0992070 A1 | 4/2000 |
| EP | 1361614 A1 | 11/2003 |
| EP | 1460681 A2 | 9/2004 |
| EP | 1693896 A1 | 8/2006 |
| EP | 1806787 A1 | 7/2007 |
| EP | 1845561 A2 | 10/2007 |
| EP | 1885000 A2 | 2/2008 |
| EP | 2015364 A2 | 1/2009 |
| EP | 2259326 A1 | 12/2010 |

(56) References Cited

FOREIGN PATENT DOCUMENTS

| | | |
|---|---|---|
| JP | 60240158 | 11/1985 |
| JP | 62136072 A | 6/1987 |
| JP | 01117363 A2 | 5/1989 |
| JP | 2137368 A | 5/1990 |
| JP | 03034466 A2 | 2/1991 |
| JP | 03105975 A | 5/1991 |
| JP | 03157974 | 7/1991 |
| JP | 03225870 | 10/1991 |
| JP | 7066433 A | 3/1995 |
| JP | H07-221327 A | 8/1995 |
| JP | 08097441 A | 4/1996 |
| JP | 08264766 | 10/1996 |
| JP | 08316164 A | 11/1996 |
| JP | 09009522 A | 1/1997 |
| JP | 09205202 | 8/1997 |
| JP | 11008399 A | 1/1999 |
| JP | 11191559 | 7/1999 |
| JP | 11238742 | 8/1999 |
| JP | 11261061 | 9/1999 |
| JP | 11266017 | 9/1999 |
| JP | 11274487 | 10/1999 |
| JP | 2000049167 A | 2/2000 |
| JP | 2000077682 A | 3/2000 |
| JP | 2000082812 A | 3/2000 |
| JP | 2000101100 A | 4/2000 |
| JP | 2000106371 A | 4/2000 |
| JP | 2000252478 A | 9/2000 |
| JP | 2000261006 A | 9/2000 |
| JP | 2001085704 A | 3/2001 |
| JP | 2002026341 A | 1/2002 |
| JP | 2002314099 A | 10/2002 |
| JP | 2003197921 A | 7/2003 |
| JP | 2003318389 A | 11/2003 |
| JP | 2004055586 A | 2/2004 |
| JP | 2005057080 A | 3/2005 |
| JP | 2006324585 A | 11/2006 |
| JP | 2007042997 A | 2/2007 |
| JP | 2007235768 A | 9/2007 |
| JP | 2008034646 A | 2/2008 |
| JP | 2008042198 A | 2/2008 |
| JP | 2008053418 A | 3/2008 |
| JP | 2008112774 A | 5/2008 |
| JP | 2008147362 A | 6/2008 |
| JP | 2008541459 A | 11/2008 |
| JP | 2009177028 A | 8/2009 |
| JP | 2009277806 A | 11/2009 |
| WO | 9708754 A2 | 3/1997 |
| WO | 9743789 A1 | 11/1997 |
| WO | 9802924 A2 | 1/1998 |
| WO | 9808259 A1 | 2/1998 |
| WO | 9832178 A1 | 7/1998 |
| WO | 2005065385 A2 | 7/2005 |
| WO | 2006122252 A2 | 11/2006 |
| WO | 2006135031 A2 | 12/2006 |
| WO | 2007040710 A1 | 4/2007 |
| WO | 2007139487 A1 | 12/2007 |
| WO | 2012128934 A1 | 9/2012 |

OTHER PUBLICATIONS

Agarwal, A.K. et al., "1.1 kV 4H-SiC Power UMOSFETs", IEEE Electron Devices Letters, Dec. 1997, vol. 18, No. 12, pp. 586-588.
Agarwal, A.K. et al., "1400 V 4H-SiC Power MOSFETs", Materials Science Forum, Published: 1998, vols. 264-268, pp. 989-992.
Agarwal, A.K. et al., "A Critical Look at the Performance Advantages and Limitations of 4H-SiC Power UMOSFET Structures", Proceedings of the International Symposium on Power Semiconductor Devices and IC's, Published: 1996, pp. 119-122.
Agarwal, A.K. et al., "Investigation of Lateral RESURF, 6H-SiC MOSFETs", Materials Science Forum, Published: 2000, vols. 338-342, pp. 1307-1310.
Agarwal, A.K. et al., "Temperature Dependence of Fowler-Nordheim Current in 6H- and 4H-SiC MOS Capacitors", IEEE Electron Device Letters, Dec. 1997, vol. 18, No. 12, pp. 592-594.
Alok, Dev. et al., "Process Dependence of Inversion Layer Mobility in 4H-SiC Devices", Silicon Carbide and Related Materials, Published: 1999, pp. 1077-1080.
Asano, K. et al., "Dynamic Characteristics of 6.2 kV High Voltage 4H-SiC pn Diode with Low Loss", Transactions of the Institute of Electrical Engineers of Japan, May 2003, vol. 123-D, No. 5, pp. 623-627.
Author Unknown, "Motorola Power MOSFET Transistor Databook", 4th Edition, Motorola, Inc., Copyright: 1998, pp. 254-257. 6 total pages.
Author Unknown, "Figure 3", Compound Semiconductor.Net, Updated: May 2006, Retrieved: Jul. 7, 2006, http://www.compoundsemiconductor.net, 4 pages.
Author Unknown, "Insulated-Gate Bipolar Transistor", Wikipedia—The Free Encyclopedia, Updated in Jun. 11, 2010, Retrieved on Jun. 21, 2010, http://en.wikipedia.org/wiki/Insulated-gate_bipolar_transistor, 6 pages.
Author Unknown, "The Insulated Gate Biopolar Transistor (IGBT)", University of Glasgow, Retrieved: Feb. 14, 2007, http://www.elec.gla.ac.uk/groups/dev_mod/papers/igbt/igbt.html, 3 pages.
Ayalew, T., "4.4.3.1 MPS Diode Structure", Tu Wien. Jul. 6, 2006, http://www.iue.tuwien.ac.at/phd/ayalew/node88.html, 2 pages.
Baliga, B., "Chapter 7: Power Mosfet", Power Semiconductor Devices, Copyright: 1996, pp. 335-425, Boston, MA, PWS Publishing Company, 93 total pages.
Baliga, B., "Chapter 8: Insulated Gate Bipolar Transistor", Power Semiconductor Devices, Copyright: 1996, pp. 426-502, Boston, MA, PWS Publishing Company, 79 total pages.
Non-Final Office Action for U.S. Appl. No. 12/124,341, mailed Oct. 18, 2010, 7 pages.
Bhatnagar, Mohit et al., "Comparison of 6H-SiC, 3C-SiC, and Si for Power Devices", IEEE Transactions on Electron Devices, Mar. 1993, vol. 40, No. 3, pp. 645-655.
Buchner, R. et al., "Laser Recrystallization of Polysilicon for Improved Device Quality", Springer Proceedings in Physics, Copyright: 1989, vol. 55, pp. 289-294.
Capano, M.A. et al., "Ionization Energies and Electron Mobilities in Phosphorus- and Nitrogen-Implanted 4H Silicon Carbide", IEEE ICSCRM Conference 1999, Oct. 10-13, 1999, 4 pages.
Capano, M.A. et al., "Surface Roughening in Ion Implanted 4-H Silicon Carbide", Journal of Electronic Materials, Received Jul. 20, 1998, vol. 28, No. 3, pp. 214-218.
Casady, J.B. et al., "900 V DMOS and 1100 V UMOS 4H-SiC Power FETs", Northrop Grumman Science and Technology Center, Published: 1997, 2 Pages.
Chakraborty, Supratic et al., "Interface Properties of N2O-Annealed SiO2/SiC System", IEEE, Copyright: 2000, pp. 108-111.
Chang, K.C. et al., "Observation of a Non-Stoichiometric Layer at the Silicon Dioxide—Silicon Carbide Interface: Effect of Oxidation Temperature and Post-Oxidation Processing Conditions", Materials Research Social Symposium Procedures, Copyright: 2001, vol. 640, 6 pages.
Chen, Jia-Rong et al., "Theoretical Analysis of Current Crowding Effect in Metal/AlGaN/GaN Schottky Diodes and its Reduction by Using Polysilicon in Anode", Chinese Physics Letters, Jul. 2007, vol. 24, No. 7, pp. 2112-2114.
Cho, Won-Ju et al., "Improvement of Charge Trapping by Hydrogen Post-Oxidation Annealing in Gate Oxide of 4H-SiC metal-oxide-semiconductor capacitors", Applied Physical Letters, Aug. 21, 2000, vol. 77, No. 8, 1215-1217.
Chung, Gilyong et al., "Effects of Anneals in Ammonia on the Interface Trap Density Near the Band Edges in 4H-Silicon Carbide Metal-Oxide-Semiconductor Capacitors", Applied Physical Letters, Nov. 27, 2000, vol. 77, No. 22, pp. 3601-3603.
Chung, G.Y. et al., "The Effect of Si:C Source Ration on S102 /SiC Interface State Density for Nitrogen Doped 4H and 6H SiC", Materials Science Forum, Copyright: 2000, vol. 338-342, pp. 1097-1100.
Chung, G.Y. et al., "Effect of Nitric Oxide Annealing on the Interface Trap Densities Near the Band Edges in the 4H Polytype Silicon Carbide", Applied Physics Letters, Mar. 27, 2000, vol. 76, No. 13, pp. 1713-1715.

(56) References Cited

OTHER PUBLICATIONS

Chung, G.Y. et al., "Improved Inversion Channel Mobility for 4h-SiC MOSFETs Following High Temperature Anneals in Nitric Oxide", IEEE Electron Device Letters, Apr. 2001, vol. 22, No. 4, pp. 176-178.

Dahlquist, F. et al., "A 2.8kV, Forward Drop JBS Diode with Low Leakage", Materials Science Forum, Copyright: 2000, vols. 338-342, pp. 1179-1182.

Das, Mrinal K. et al., "A 13 kV 4H-SiC n-Channel IGBT with Low Rdiff on and Fast Switching", DARPA Contract, Published: 2007, 4 Pages.

Das, M.K. et al., "High Mobility 4H-SiC Inversion Mode MOSFETs Using Thermally Grown", No Annealed SiO2,, IEEE 58th Device Research Conference, Jun. 19-21, 2000, 3 Pages.

Das, M.K. et al., "Inversion Channel Mobility in 4H- and 6H-SiC MOSFETs", School of Electrical and Computer Engineering at Purdue University, Published: 1998, 2 pages.

Das, Mrinal K., "Fundamental Studies of the Silicon Carbide MOS Structure", Thesis submitted to Purdue University for Doctorate of Philosophy Program, Dec. 1999, 160 Pages.

Dastidar, Sujoyita, "A Study of P-Type Activation in Silicon Carbide", Thesis submitted to Faculty of Purdue University for Master of Science in Electrical Engineering, May 1998, 102 Pages.

De Meo, R.C. et al., "Thermal Oxidation of SiC in N2O", The Electrochemical Society, Inc., Nov. 1994, vol. 141, No. 11, pp. L150-L152.

Del Prado, A. et al., "Full Composition Range Silicon Oxynitride Films Deposited by ECR-PECVD at Room Temperature", Thin Solid Films, Published: 1999, vols. 343-344, pp. 437-440.

Dimitrijev, Sima et al., "Nitridation of Silicon-Dioxide Films Grown on 6H Silicon Carbide", IEEE Electron Device Letters, May 1997, vol. 18, No. 5, pp. 175-177.

Feldman, Leonard C. et al., "High Performance SiC Power Devices via Atomic Scale Engineering", 1999 DARPA/MTO High Power and ONR Power Switching Review, Aug. 10-12, 1999, 20 pages.

Fisher, C.A. et al., "The Performance of High-Voltage Field Relieved Schottky Barrier Diodes", IEE Proceedings, Dec. 1985, vol. 132, Pt. 1, No. 6, pp. 257-260.

Fukuda, Kenji et al., "Improvement of SiO2/4H-SiC Interface by Using High Temperature Hydrogen Annealing at 1000• C", External Abstracts of the 1998 International Conference on Solid State Devices and Materials, Published: 1998, pp. 100-101.

Fukuda, Kenji et al., "Improvement of SiO2/4H-SiC Interface Using High-Temperature Hydrogen Annealing at Low Pressure and Vacuum Annealing", Japanese Journal of Applied Physics, Copyright: 1999, vol. 38, pp. 2306-2309.

Final Office Action for U.S. Appl. No. 12/124,341, mailed Jun. 21, 2011, 8 pages.

Goh, W.L. et al., "Buried Metallic Layers in Silicon Using Wafer Fusion Bonding Techniques", Proceedings of the Mediterranean Electrotechnical Conference. Apr. 12, 1994, vol. 1, No. Conf. 7, pp. 625-628.

Hubel, Kerstin, "Hybrid Design Improves Diode Robustness and Boosts Efficiency", Compound Semiconductor.Net, Updated: May 2006, Retrieved: Jul. 7, 2006, http://www.compoundsemiconductor.net, 4 pages.

Hull, Brett A. et al., "Drift-Free 10-kV, 20-A 4H-SiC PiN Diodes", Journal of Electronic Materials, Published: 2005, vol. 34, No. 4, pp. 341-344.

Jamet, P. et al., "Physical Properties of N/sub 2/0 and No-Nitrided Fate Oxides Grown on 4H Sic", Applied Physics Letters, Jul. 2001, vol. 79, No. 3, pp. 323-325.

Restriction Requirement for U.S. Appl. No. 12/124,341, mailed Jul. 13, 2010, 6 pages.

Sze, S.M., "Chapter 5: Bipolar Transistor and Related Devices", Semiconductor Devices Physics and Technology, Copyright: 2002, p. 130, United States of America, John Wiley & Sons, Inc., 3 total pages.

Kinoshita, Kozo et al., "Guard Ring Assisted RESURF: A New Termination Structure Providing Stable and High Breakdown Voltage for SiC Power Devices", IEEE, Copyright: 2002, pp. 253-256.

Kobayashi, K. et al., "Dielectric Breakdown and Current Conduction of Oxide/Nitride/Oxide Multi-Layer Structures", 1990 Symposium of VLSI Technology, Copyright 1990, pp. 119-120.

Krishnaswami, Sumi et al., "High Temperature Characterization of 4H-SiC Bipolar Junction Transistors", Materials Science Forum, Jan. 1, 2006, vols. 527-529, pp. 1437-1440, 5 total pages.

Lai, P.T. et al., "Effects of Nitridation and Annealing on Interface Properties of Thermally Oxidized SIO2 /SiC Metal-Oxide-Semiconductor System", Applied Physics Letters, Jun. 19, 2000, vol. 75, No. 25, pp. 3744-3748.

Lai, P.T. et al., "Interface properties of N2O-Annealed NH3-Treated 6H-SiC MOS Capacitor", IEEE, Copyright: 1999, pp. 46-49.

Levinshtein, Michael E. et al., "On the Homogeneity of the Turn-On Process in High-Voltage 4H-SiC Thyristors", Solid-State Electronics, Published: 2005, vol. 49, pp. 233-237.

Li, Y. et al., "High-Voltage (3 kV) UMOSFETs in 4H-SiC", IEEE Transactions on Electron Devices, Jun. 2002, vol. 49, No. 6, pp. 972-975.

Li, H.F. et al., "Improving SiO2 Grown on P-Type 4H-SiC by NO Annealing", Materials Science Forum, Copyright: 1998, vol. 264-268, pp. 869-872.

Lipkin, Lori et al., "Challenges and State-of-the-Art of Oxides on SiC", Material Research Social Symposium Proceedings, Copyright: 2001, vol. 640, 10 pages.

Lipkin, Lori et al., "Insulator Investigation on SiC for Improved Reliability", IEEE Transactions on Electron Devices, Mar. 1999, vol. 46, No. 3, pp. 525-532.

Lipkin, L.A. et al., "Low Interfaces State Density Oxides on P-Type SiC", Materials Science Forum, Copyright: 1998, vols. 264-268, pp. 853-856.

Losee, P.A. et al., "High-Voltage 4H-SiC PiN Rectifiers with Single-Implant, Multi-Zone JTE Termination", Proceedings for 2004 International Symposium on Power Semiconductor Devices & ICs, Published: 2004, pp. 301-304.

Losse, P.A. et al., "Degraded Blocking Performance of 4H-SiC Rectifiers Under High dV/dt Conditions", Proceedings for 17th International Symposium on Power Semiconductor Devices & ICs, May 23-26, 2005, pp. 1-4.

Ma, Y. et al., "Fixed and Trapped Charges at Oxide-Nitride-Oxide Heterostructure Interfaces Formed by Remote Plasma Enhanced Chemical Vapor Deposition", American Vacuum Society, Copyright: 1993, vol. 11, No. 4, pp. 1533-1540.

Mondal, K. et al., "An Integrated 500-V Power DMOSFET/ Antiparallel Rectifier Device with Improved Diode Reverse Recovery Characteristics", IEEE Electron Device Letters, Sep. 2002, vol. 23, No. 9, pp. 562-564.

Mutin, P. Hubert, "Control of the Composition and Structure of Silicon Oxycarbide and Oxynitride Glasses Derived from Polysiloxane Precursors", Journal of Sol-Gel Science and Technology, Copyright: 1999, pp. 27-38.

Myer-Ward, R.L. et al., "Turning of Basal Plane Dislocations During Epitaxial Growth on 4 Off-Axis 4h-SiC", 7th European Conference on Silicon Carbide and Related Materials, Sep. 7-11, 2008, http://escrm08.com/invited_presentations.html, Barcelona, Spain, 2 pages.

Palmour, J.W. et al., "SiC Device Technology: Remaining Issues", Diamond and Related Materials 6, Published: 1997, pp. 1400-1404.

Palmour, John, "Silicon Carbide npnp Thyristors", NASA Tech Briefs. Updated: Dec. 1, 2000, Retrieved Sep. 2, 2010, http://www.techbriefs.com/component/content/article/7031, 3 pages.

Pankin, D. et al., "Electrical and Microstructural Properties of Highly Boron-Implantation Doped 6H-SiC", Journal of Applied Physics, Mar. 15, 2001, vol. 89, No. 6, pp. 3162-3167.

Pantelides, S.T. et al., "Atomic-Scale Engineering of the SiC-SiO2 Interface", Materials Science Forum, Copyright: 2000, vols. 338-342, pp. 1133-1136.

Patel, R. et al., "Phosphorus-Implanted High-Voltage N+P 4H-SiC Junction Rectifiers", Proceedings of 1998 International Symposium on Power Semiconductor Devices & Ics, Published: 1998, pp. 387-390.

(56) References Cited

OTHER PUBLICATIONS

Rao, Mulpuri V. et al., "P-N Junction Formation in 6H-SiC Acceptor Implantation into a N-Type Substrate", Nuclear Instructions and Mechanics in Physics Res., Published: 1995, vol. 106, pp. 333-338.
Rao, S. et al., "Silane Overpressure Post-Implant Annealing of Al Dopants in SiC: Cold Wall CVD Apparatus", Applied Surface Science, Published: 2006, vol. 252, pp. 3837-3842.
Rao, Mulpuri V., "Maturing Ion-Implantation Technology and its Device Applications in SiC", Solid State Electronics, Apr. 19, 2002, vol. 47, pp. 213-222.
Richmond, J.T. et al., "Hybrid 4H-SiC MOS Gated Transistor (MGT)", DARPA Contract #N00014-99-C-0377 & DARPA Contract #N00014-95-1-1302, Published: 2002, 6 pages.
Ryu, Sei-Hyung et al., "27 mΩ-cm2, 1.6 kV Power DiMOSFETs in 4H-SiC", Proceedings of the 14th International Symposium on Power Semiconductor Devices & ICs 2002, ISPSD '02 Proceedings, Jun. 4-7, 2002, 18 pages.
Schörner, Reinhold et al., "Rugged Power MOSFETs in 6H-SiC with Blocking Capability up to 1800V", Silicon Carbide and Related Materials, Copyright: 2000, vols. 338-342, pp. 1295-1298.
Schörner, Reinhold et al., "Significantly Improved Performance of MOSFET's on Silicon Carbide Using the 15R-SiC Polytype", IEEE Electron Device Letters, May 1999, vol. 20, No. 3, pp. 241-244.
Senzaki, Junji et al., "Effects of Pyrogenic Reoxidation Annealing on Inversion Channel Mobility of 4H-SiC Metal-Oxide-Semiconductor Field-effect Transistor Fabricated on (1120) Face", The Japanese Society of Applied Physics, Nov. 15, 2001, vol. 40, pp. 1201-1203.
Shenoy, Jayarama N. et al., "High-Voltage Double-Implanted Power MOSFET's in 6H-SiC", IEEE Electron Device Letters, Mar. 1997, vol. 18, No. 3, pp. 93-95.
Shenoy, Praveen M. et al., "The Planar 6H-SiC Accufet: A New High-Voltage Power MOSFET Structure", IEEE Electron Device Letters, Sep. 1999, vol. 18, No. 12, pp. 589-591.
Singh, R. et al., "Planar Terminations in 4H-SIC Schottky Diodes with Low Leakage and High Yields", ISPSD '97, Copyright: 1997, pp. 157-160.
Singh, R. et al., "High Temperature, High Current, 4H-SiC Accu-DMOSFET", Silicon Carbide and Related Materials, Published: 2000, vols. 338-342, pp. 1271-1274.
Sridevan, S. et al., "Lateral N-Channel Inversion Mode 4H-SiC MOSFET's", IEEE Electron Devices Letters, Jul. 1998, vol. 19, No. 7, pp. 228-230.
Sridevan, S. et al., "On the Prescence of Aluminum in Thermally Grown Oxides on 6H-Silicon Carbide", IEEE Electron Devices Letters, Mar. 1996, vol. 17, No. 3, pp. 136-138.
Stein Von Kamienski, E.G. et al., "Long Term Stability of Gate-Oxides on N- and P-Type Silicon Carbide Studies by Charge Injection Techniques", Materials Science and Engineering, Published: 1997, vol. 46, pp. 263-266.
Stengl, R. et al., "Variation of Lateral Doping—A New Concept to Avoid High Voltage Breakdown of Planar Junctions", Siemens Research Laboratories, Jan. 12, 1985, 4 pages.
Stengl, R. et al., "Variation of Lateral Doping as a Field Terminator for High-Voltage Power Devices", IEEE Transactions on Electron Devices, Mar. 1986, vol. ED-33, No. 3, pp. 426-428.
Streetman, Ben G., "Chapter 7: Bipolar Junction Transistors", Solid State Electronic Devices, Copyright: 1980, pp. 228-284, Englewood Cliffs, NJ, Prentice-Hall, Inc., 33 total pages.
Sugawara, Yoshitaka et al., "3.6 kV 4H-SiC JBS Diodes with Low RonS", Materials Science Forum: Silicon Carbide and Related Materials, Copyright: 2000, vol. 338-342, pp. 1183-1186.
Sundaresan, Siddarth G. et al., "Ultra-Low Resistivity Al+ Implanted 4H-SiC Obtained by Microwave Annealing and a Protective Graphite Cap", Solid-State Electronics 52, Published: 2008, pp. 140-145.
Suvorov, A.V. et al., "4H-Sic Self-Aligned Implant-Diffused Structure for Power DMOSFETs", Materials Science Forum, Copyright: 2000, vols. 338-342, pp. 1275-1278.

Suzuki, Seiji et al., "Effect of Post-Oxidation-Annealing in Hydrogen on SiO2 /4H-SiC Interface", Materials Science Forums, Copyright: 2000, vols. 338-342, pp. 1073-1076.
Sze, S.M., "Si-SiO2 MOS Diode", Physics of Semiconductor Devices, 2nd Edition, Copyright: 1981, pp. 383-390, Korea, John Wiley & Sons, Inc., 10 total pages.
Tan, J. et al., "High-Voltage Accumulation-Layer UMOSFET's in 4H-SiC", IEEE Electron Device Letters, Sep. 1998, vol. 49, No. 12, pp. 487-489.
Thomas, Chris et al., "Annealing of Ion Implantation Damage in SiC Using a Graphite Mask", Materials Research Society Symposium Proc., Copyright: 1999, vol. 572, pp. 45-50.
Tobin, Philip et al., "Furnace Formation of Silicon Oxynitride Thin Dielectrics in Nitrous Oxide N2O: The Role of Nitric Oxide (NO)", Junior Applied Physics, Feb. 1, 1994, vol. 75, No. 3, pp. 1811-1817.
Torvik, John et al., "Electrical Characterization of GaN/SiC n-p Heterojunction Diodes", Applied Physics Letters, Published: 1998, vol. 72, pp. 1371-1373.
Treu, M. et al., "A Surge Current Stable and Avalanche Rugged SiC Merged Pn Schottky Diode Blocking 600V Especially Suited for PFC Applications", Materials Science Forum: Silicon Carbide and Related Materials, Copyright: 2005, vol. 527-539, pp. 1155-1158.
Ueno, Katsunori et al., "The Guard-Ring Termination for High-Voltage SiC Schottky Barrier Diodes", IEEE Electron Device Letters, Jul. 1995, vol. 16, No. 7, pp. 331-332.
International Preliminary Report on Patentability for International Patent Application No. PCT/US2009/003089, mailed Nov. 23, 2010, 7 pages.
International Search Report for Patent Application No. PCT/2012/27874, mailed Jul. 13, 2012, 7 pages.
Non-Final Office Action for U.S. Appl. No. 13/547,014, mailed Nov. 9, 2012, 13 pages.
Final Office Action for U.S. Appl. No. 13/547,014, mailed Apr. 4, 2013, 8 pages.
Japanese Office Action for Japanese Patent Application No. 2011-510504, mailed Apr. 26, 2013, 8 pages.
Final Office Action for U.S. Appl. No. 12/719,412, mailed Jul. 31, 2013, 19 pages.
Advisory Action for U.S. Appl. No. 13/547,014, mailed Jul. 31, 2013, 3 pages.
Notice of Allowance for U.S. Appl. No. 13/229,750, mailed Aug. 23, 2013, 8 pages.
Final Office Action for U.S. Appl. No. 13/229,752, mailed Jul. 29, 2013, 6 pages.
Notice of Allowance for U.S. Appl. No. 13/547,014, mailed Aug. 30, 2013, 8 pages.
Notice of Allowance for U.S. Appl. No. 13/229,752, mailed Oct. 10, 2013, 10 pages.
Advisory Action for U.S. Appl. No. 12/719,412, mailed Oct. 15, 2013, 3 pages.
Notice of Allowance for U.S. Appl. No. 13/229,749, mailed Oct. 28, 2013, 11 pages.
Notice of Allowability for U.S. Appl. No. 13/229,752, mailed Jan. 13, 2014, 5 pages.
Non-Final Office Action for U.S. Appl. No. 12/719,412, mailed Dec. 12, 2013, 7 pages.
Baliga, B.J., "The Pinch Rectifier: A Low-Forward-Drop High-Speed Power Diode," IEEE Electron Device Letters, vol. EDL-5, No. 6, Jun. 1984, pp. 194-196.
Itoh, A. et al. "Analysis of Schottky Barrier Heights of Metal/SiC Contacts and Its Possible Application to High-Voltage Rectifying Devices" Phys. Stat. Sol. (A), vol. 162, Copyright: 1997, pp. 225-245.
Itoh, A. et al., "Excellent Reverse Blocking Characteristics of High-Voltage 4H-SiC Schottky Rectifiers with Boron-Implanted Edge Termination" IEEE Electron Device Letters, vol. 17, No. 3, Mar. 1996, pp. 139-141.
Karlsteen, M. et al., "Electrical Properties of Inhomogeneous SiC MIS Structures," Journal of Electronic Materials, vol. 24, No. 7, Copyright: 1995, pp. 853-861.
Matsunami, Hiroyuki et al., "Step-controlled Epitaxial Growth of SiC: High Quality Homoepitaxy," Materials Science and Engineering, vol. B201997, Copyright: 1997, pp. 125-166.

(56) References Cited

OTHER PUBLICATIONS

Mohammad, S.N. et al., "Near Ideal Plantinum-GaN Schottky Diodes," Electronic Letters, Mar. 14, 1996, vol. 32, No. 6, pp. 598-599.
Rao, M.V. et al., "Al and N Ion Implantations in 6H-SiC," Inst. Phys. Conf. Ser. No. 142: Chapter 3, Copyright: 1996, pp. 521-524.
Author Unknown, "Data Book for Metals" published as early as Mar. 19, 2009, pp. 194.
Wang, Lei et al., "High Barrier Heigh GaN Schottky Diodes: Pt/GaN and Pd/GaN," Applied Physics Letters, vol. 68, No. 9, Feb. 26, 1996, pp. 1267-1269.
Wilamoski, Bodgan M., "Schottky Diodes with High Breakdown Voltages," Solid-State Electronics, vol. 26, No. 5, Copyright: 1983, pp. 491-493.
Non-Final Office Action for U.S. Appl. No. 13/229,749, mailed Jan. 25, 2013, 29 pages.
Final Office Action for U.S. Appl. No. 13/229,749, mailed Jun. 10, 2013, 33 pages.
Notice of Allowance for U.S. Appl. No. 13/229,749, mailed Aug. 20, 2013, 9 pages.
Non-Final Office Action for U.S. Appl. No. 13/229,750, mailed Oct. 2, 2012, 15 pages.
Notice of Allowance for U.S. Appl. No. 13/229,750, mailed Jan. 31, 2013, 7 pages.
Non-Final Office Action for U.S. Appl. No. 13/229,752, mailed Mar. 21, 2013, 17 pages.
International Search Report and Written Opinion for PCT/US2012/054091 mailed Dec. 5, 2012, 12 pages.
International Search Report and Written Opinion for PCT/US2012/054092 mailed Dec. 5, 2012, 12 pages.
International Search Report and Written Opinion for PCT/US2012/054093 mailed Dec. 5, 2012, 12 pages.
Perez, Raul et al., "Planar Edge Termination Design and Technology, Considerations for 1.7-kV 4H-Sic PiN Diodes," IEEE Transactions on Electron Devices, vol. 53, No. 10, Oct. 2005, IEEE, pp. 2309-2316.
Non-Final Office Action for U.S. Appl. No. 14/169,266, mailed Oct. 22, 2014, 8 pages.
Notice of Allowance for U.S. Appl. No. 12/719,412, mailed Apr. 14, 2014, 8 pages.
Notice of Allowance for U.S. Appl. No. 12/719,412, mailed Jul. 1, 2014, 8 pages.
Non-Final Office Action for U.S. Appl. No. 14/087,416, mailed May 23, 2014, 11 pages.
Final Office Action for U.S. Appl. No. 14/087,416, mailed Sep. 30, 2014, 9 pages.
Decision to Grant for Japanese Patent Application No. 2011-510504, issued Mar. 28, 2014, 5 pages.
Office Action for Taiwanese Patent Application No. 101133188, mailed Aug. 14, 2014, 18 pages.
International Preliminary Report on Patentability for International Patent Application No. PCT/US2012/054091, mailed Mar. 20, 2014, 7 pages.
International Preliminary Report on Patentability for International Patent Application No. PCT/US2012/054092, mailed Mar. 20, 2014, 7 pages.
International Preliminary Report on Patentability for International Patent Application No. PCT/US2012/054093, mailed Mar. 20, 2014, 7 pages.
Office Action for Japanese Patent Application No. 2012-557150, mailed Jan. 29, 2014, 9 pages.
European Search Report for European Patent Application No. 11753868.6-1552, mailed Mar. 25, 2014, 9 pages.
Office Action for Taiwanese Patent Application No. 101133195, mailed Sep. 1, 2014, 20 pages.
Office Action for Taiwanese Patent Application No. 101133190, mailed Sep. 24, 2014, 12 pages.
Decision of Grant for Japanese Patent Application No. 2012-557150, issued Nov. 5, 2014, 6 pages.
Ueno, Katsunori et al., "4H-SiC MOSFET's Utilizing the H2 Surface Cleaning Technique", IEEE Electron Device Letters, Jul. 1998, vol. 19, No. 7, pp. 244-246.
Ueno, Katsunori et al., "Counter-Doped MOSFET's of 4H-SiC", IEEE Electron Device Letters, Dec. 1999, vol. 20, No. 12, pp. 624-626.
Vassilveski, K. et al., "High Voltage Silicon Carbide Schottky Diodes with Single Zone Junction Termination Extension", Materials Science Forum, Copyright: 2007, pp. 873-876, Switzerland, Trans Tech Publications.
Vassilveski, K.V. et al., "Protection of Selectively Implanted and Patterned Silicon Carbide Surfaces with Graphite Capping Layer During Post-Implantation Annealing", Semiconductor Science and Technology, Feb. 3, 2005, pp. 271-278, Institute of Physics Publishing.
Vathulya, Vickram et al., "A Novel 6H-SiC Power DMOSFET with Implanted P-Well Spacer", IEEE Electron Device Letters, Jul. 1999, vol. 20, No. 7, pp. 354-356.
Vathulya, Vickram et al., "Characterization of Channel Mobility of Implanted SiC to Determine Polytype Suitability for the Power DIMOS Structure", Powerpoint Presentation at Lehigh University, Presented 2000, 26 total slides, 13 pages.
Wang, Xiewen W. et al., "High Temperature Characteristics of High-Quality SiC MIS Capacitors with O/N/O Gate Dielectric", IEEE Transactions on Electron Devices, Feb. 2000, vol. 47, No. 2, pp. 450-462.
Wang, Y. et al., "Accumulation-Mode SiC Power MOSFET Design Issues", Material Science Forum, Feb. 2000, vols. 338-342, pp. 1287-1290.
Williams, J.R. et al., "Passivation of the 4H-SiC/SiO2 Interface with Nitric Oxide", Materials Science Forum, Copyright: 2002, vols. 389-393, pp. 967-972.
Xu, J.P. et al., "Improved Performance and Reliability of N20-Grown Oxynitride on 6H-SiC", IEEE Electron Device Letters, Jun. 2000, vol. 21, No. 6, pp. 298-300.
Yilmaz, Hamza, "Optimization and Surface Charge Sensitivity of High Voltage Blocking Structures with Shallow Junctions", IEEE Transactions on Electron Devices, Jul. 1991, vol. 38, No. 7, pp. 1666-1675.
Zhang, Qingchun at al., "A 10-kV Monolithic Darlington Transistor with βforced of 336 in 4H-SiC", Feb. 2009, IEEE Electron Device Letters, Feb. 2009, vol. 30, No. 2, pp. 142-144.
Zhang, Qingchun et al., "12 Kv 4H-SiC p-IGBTs with Record Low Specific On-Resistance", Materials Science Forum, Published: 2007, vols. 600-603, 4 pages.
Zhang, Qingchun et al., "Design and Fabrications of High Voltage IGBTs on 4H-SiC", Power semiconductor devices and IC's, 2006 IEEE International Symposium, Jun. 4-8, 2006, 4 pages.
Non-Final Office Action for U.S. Appl. No. 12/719,412, mailed Jan. 7, 2013, 20 pages.
Notice of Allowance for U.S. Appl. No. 13/229,750, mailed May 14, 2013, 8 pages.
China Patent Office Action for Chinese Patent Application No. 200780029460.5, mailed Jan. 22, 2010, 7 pages.
European Search Report for European Patent Application No. 07112298.0, mailed Jan. 16, 2012, 7 pages.
European Search Report for European Patent Application No. 09177558.5, mailed Feb. 22, 2010, 6 pages.
European Search Report for European Patent Application No. 07120038.0, mailed Jun. 16, 2008, 7 pages.
European Search Report for European Patent Application No. 09163424.6, mailed Apr. 9, 2010, 10 pages.
Extended European Search Report for European Patent Application No. 07112298.0, mailed Feb. 18, 2009, 12 pages.
International Preliminary Report on Patentability for International Application No. PCT/US2010/035709, mailed on Dec. 15, 2011, 8 pages.
International Preliminary Report on Patentability for International Application No. PCT/US2010/035713, mailed on Dec. 15, 2011, 8 pages.
International Preliminary Report on Patentability for International Application No. PCT/US2011/031150, mailed on Oct. 26, 2012, 8 pages.

(56) References Cited

OTHER PUBLICATIONS

International Search Report for International Patent Application No. PCT/US/01/30715 mailed Jun. 5, 2002, 9 pages.
International Search Report for International Patent Application No. PCT/US/01/42414, mailed Apr. 23, 2002, 10 pages.
International Search Report for International Patent Application No. PCT/US/02/11691, mailed Dec. 17, 2002, 9 pages.
International Search Report for International Patent Application No. PCT/US2004/004982 mailed Jul. 22, 2004, 13 pages.
International Search Report for International Patent Application No. PCT/US2011/027383, mailed May 20, 2011, 8 pages.
International Search Report for International Patent Application No. PCT/US2010/025053, mailed Jul. 2, 2010, 18 pages.
International Search Report for US Patent Application No. 2007/0014139, mailed Feb. 4, 2008, 15 pages.
International Search Report for US Patent Application No. 2008/0008574, mailed Sep. 26, 2008, 15 pages.
International Search Report for US Patent Application No. 2008/0010538, mailed Dec. 22, 2008, 13 pages.
International Search Report for US Patent Application No. 2009/0000734, mailed Apr. 23, 2009, 13 pages.
International Search Report for US Patent Application No. 2009/0003089, mailed Aug. 20, 2009, 16 pages.
International Search Report for US Patent Application No. 2009/0065251, mailed Jun. 1, 2010, 14 pages.
International Search Report for US Patent Application No. 2010/0020071, mailed Mar. 26, 2010, 14 pages.
International Search Report for US Patent Application No. 2010/0025053, mailed May 3, 2010, 7 pages.
Invitation to Pay Additional Fee for US Patent Application No. 2007/0010192, mailed Oct. 29, 2007, 10 pages.
Notice of Transmittal of International Search Report and Written Opinion for PCT/US2008/004239, mailed Mar. 2, 2009, 14 pages.
Notice of Transmittal of International Search Report for US Patent Application No. 2010/0026632, mailed Oct. 8, 2010, 16 pages.
Notice of Transmittal of International Search Report for US Patent Application No. 2010/0028612, mailed Jun. 17, 2010, 10 pages.
Notice of Transmittal of International Search Report for US Patent Application No. 2010/0035713, mailed Jul. 27, 2010, 14 pages.
Notice of Transmittal of International Search Report for US Patent Application No. 2010/0042075, mailed Sep. 24, 2010, 15 pages.
Notification Concerning Transmittal of International Preliminary Report on Patentability for International Application No. PCT/US2011/027383, mailed Sep. 20, 2012, 7 pages.
International Preliminary Report on Patentability for US Patent Application No. 2007/0010192, mailed Sep. 23, 2008, 9 pages.
Notice of Allowance for U.S. Appl. No. 12/124,341, mailed Apr. 9, 2012, 8 pages.
Japanese Office Action for Japanese Patent Application No. 2011-510504, mailed Mar. 26, 2013, 2 pages.
European Search Report for European Patent Application No. 09750952.5-1235, mailed Mar. 8, 2012, 5 pages.
Advisory Action for U.S. Appl. No. 14/087,416, mailed Dec. 29, 2014, 3 pages.
Decision of the Intellectual Property Office for Taiwanese Patent Application No. 101133188, issued Mar. 24, 2015, 24 pages.
Office Action of the Intellectual Property Office for Taiwanese Patent Application No. 101133195, issued Jun. 8, 2015, 4 pages.
Notice of Allowance for U.S. Appl. No. 12/719,412, mailed Jan. 22, 2015, 9 pages.
Extended European Search Report for European Patent Application No. 14184967.9, mailed Feb. 6, 2015, 6 pages.
Office Action for Japanese Patent Application No. 2014-091318, mailed Feb. 24, 2015, 17 pages.
Non-Final Office Action for U.S. Appl. No. 14/087,416, mailed Mar. 26, 2015, 11 pages.
Non-Final Office Action for U.S. Appl. No. 14/169,266, mailed Mar. 20, 2015, 8 pages.
First Office Action and Search Report for Chinese Patent Application No. 201280013926.3, mailed Aug. 28, 2015, 14 pages.
Reason for Rejection for Japanese Patent Application No. 2014-529881, mailed Jul. 2, 2015, 7 pages.
Reason for Rejection for Japanese Patent Application No. 2014-529882, mailed Jul. 2, 2015, 8 pages.
Notice of Allowance for U.S. Appl. No. 12/719,412, mailed Jun. 25, 2015, 9 pages.
Final Office Action for U.S. Appl. No. 14/087,416, mailed Aug. 27, 2015, 10 pages.
Advisory Action for U.S. Appl. No. 14/087,416, mailed Nov. 13, 2015, 3 pages.
Decision to Grant for Japanese Patent Application No. 2014-091318, mailed Mar. 22, 2016, 4 pages (No Translation).
First Office Action and Search Report for Chinese Patent Application No. 201280044076.3, issued Mar. 8, 2016, 21 pages.
First Office Action and Search Report for Chinese Patent Application No. 201280044079.7, issued Feb. 29, 2016, 13 pages.
Official Action for Japanese Patent Application No. 2014-247217, mailed Dec. 21, 2015, 6 pages.
First Office Action for Chinese Patent Application No. 201310409182.3, mailed Oct. 26, 2015, 13 pages.
First Office Action and Search Report for Chinese Patent Application No. 201280044080.X, mailed Dec. 23, 2015, 13 pages.
Non-Final Office Action for U.S. Appl. No. 14/810,678, mailed Mar. 3, 2016, 21 pages.
Non-Final Office Action for U.S. Appl. No. 14/087,416, mailed Jan. 22, 2016, 8 pages.
Examination Report for European Patent Application No. 12769789.4, mailed Jul. 7, 2016, 5 pages.
Examination Report for European Patent Application No. 12766760.8, mailed Jun. 2, 2016, 3 pages.
Final Rejection for Japanese Patent Application No. 2014-529881, mailed Jun. 30, 2016, 10 pages.
Examination Report for European Patent Application No. 12766237.7, mailed Jun. 2, 2016, 3 pages.
Final Rejection for Japanese Patent Application No. 2014-529882, mailed Jun. 30, 2016, 10 pages.
Reason for Rejection for Japanese Patent Application No. 2014-529880, mailed May 31, 2016, 21 pages.
Decision of Final Rejection for Japanese Patent Application No. 2014-247217, mailed Sep. 12, 2016, 6 pages.
Second Office Action and Search Report for Chinese Patent Application No. 201310409182.3, mailed Aug. 17, 2016, 18 pages.
Notice of Reasons for Rejection for Japanese Patent Application No. 2014-529880, mailed Sep. 21, 2016, 4 pages.
Final Office Action for U.S. Appl. No. 14/810,678, mailed Sep. 15, 2016, 21 pages.
Final Office Action for U.S. Appl. No. 14/087,416, mailed Aug. 16, 2016, 9 pages.
Second Office Action for Chinese Patent Application No. 201280044079.7, mailed Oct. 18, 2016, 6 pages.
Advisory Action, Examiner-Initiated Interview Summary, and AFCP 2.0 Decision for U.S. Appl. No. 14/810,678, mailed Nov. 29, 2016, 4 pages.
Advisory Action and AFCP 2.0 Decision for U.S. Appl. No. 14/087,416, mailed Nov. 10, 2016, 4 pages.
Non-Final Office Action for U.S. Appl. No. 14/810,678, mailed Dec. 30, 2016, 21 pages.
Shenoy, P.M. et al., "High voltage $P^+$polysilicon/$N^-$6H-SiC heterojunction diodes," Electronics Letters, vol. 33, Issue 12, Jun. 5, 1997, IET, 2 pages.
Tanaka, H. et al., "Ultra-low Von and High Voltage 4H-SiC Heterojunction Diode," Proceedings of the 17th International Symposium on Power Semiconductor Devices & IC's, May 23-26, 2005, Santa Barbara, California, IEEE, 4 pages.
Third Office Action for Chinese Patent Application No. 201310409182.3, issued Dec. 23, 2016, 12 pages.
Examination Report for European Patent Application No. 11753868.6-1552, mailed Dec. 14, 2016, 6 pages.
Decision to Grant for Japanese Patent Application No. 2014-529880, mailed Jan. 5, 2017, 6 pages.

\* cited by examiner

SEMICONDUCTOR DEVICES WITH HETEROJUNCTION BARRIER REGIONS AND METHODS OF FABRICATING SAME

CROSS REFERENCE TO RELATED APPLICATION

The present application is a continuation of U.S. patent application Ser. No. 12/719,412, which was filed on Mar. 8, 2010, now U.S. Pat. No. 9,117,739, entitled SEMICONDUCTOR DEVICES WITH HETEROJUNCTION BARRIER REGIONS AND METHODS OF FABRICATING SAME, the disclosure of which is incorporated herein by reference in its entirety.

FIELD OF THE INVENTION

The present invention relates to semiconductor devices and the fabrication of semiconductor devices and more particularly, to Junction Barrier Schottky (JBS) diodes, and the fabrication of such diodes.

BACKGROUND

High voltage silicon carbide (SiC) Schottky diodes, which may have voltage blocking ratings between, for example, about 600V and about 2.5 kV, are expected to compete with silicon PIN diodes having similar voltage ratings. Such diodes may handle as much as about 100 amps or more of forward current, depending on their active area design. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based Schottky devices are theoretically capable of much higher switching speeds, for example, in excess of about 100 times better than silicon. In addition, silicon carbide devices may be capable of handling a higher current density than silicon devices.

A conventional SiC Schottky diode structure has an n-type SiC substrate on which an n-epitaxial layer, which functions as a drift region, is formed. The device typically includes a Schottky contact formed directly on the n− layer. A junction termination region, such as a guard ring and/or p-type JTE (junction termination extension) region, is typically formed to surround the Schottky junction active region. The purpose of junction termination region is to reduce or prevent electric field crowding at the edges of the Schottky junction, and to reduce or prevent the depletion region from interacting with the surface of the device. Surface effects may cause the depletion region to spread unevenly, which may adversely affect the breakdown voltage of the device. Other termination techniques include field plates and floating field rings that may be more strongly influenced by surface effects. A channel stop region may also be formed by implantation of n-type dopants in order to prevent the depletion region from extending to the edge of the device.

Regardless of the type of termination used, the Schottky diode will fail if a large enough reverse voltage is applied to the junction. Such failures are generally catastrophic, and may damage or destroy the device. Furthermore, even before the junction has failed, a Schottky diode may experience large reverse leakage currents. In order to reduce such leakage currents, the junction barrier Schottky (JBS) diode was developed. JBS diodes are sometimes referred to as Merged PIN—Schottky (MPS) diodes. A conventional JBS diode 10 is illustrated in FIG. 1. As shown therein, a conventional JBS diode includes an n-type substrate 12 on which an n− drift layer 14 is formed. A plurality of p+ regions 16 are formed, typically by ion implantation, in the surface of the n− drift layer 14. A metal anode contact 18 is formed on the surface of the n− drift layer 14 in contact with both the n− drift layer 14 and the p+ regions 16. The anode contact 18 forms a Schottky junction with the exposed portions of the drift layer 14, and may form an ohmic contact with the p+ regions 16. A cathode contact 20 is formed on the substrate 12. Silicon carbide-based JBS diodes are described, for example, in U.S. Pat. Nos. 6,104,043 and 6,524,900.

In forward operation, the junction J1 between the anode contact 18 and the drift layer 14 turns on before the junction J2 between the p+ regions 16 and the drift layer 14. Thus, at low forward voltages, the device exhibits Schottky diode behavior. That is, current transport in the device is dominated by majority carriers (electrons) injected across the Schottky junction J1 at low forward voltages. As there may be no minority carrier injection (and thus no minority charge storage) in the device at normal operating voltages, JBS diodes have fast switching speeds characteristic of Schottky diodes.

Under reverse bias conditions, however, the depletion regions formed by the PN junctions J2 between the p+ regions 16 and the drift layer 14 expand to block reverse current through the device 10, protecting the Schottky junction J1 and limiting reverse leakage current in the device 10. Thus, in reverse bias, the JBS diode 10 behaves like a PIN diode. The voltage blocking ability of the device 10 is typically determined by the thickness and doping of the drift layer 14 and the design of the edge termination.

SUMMARY

An electronic device according to some embodiments includes a silicon carbide layer including an n-type drift region therein, a contact forming a Schottky junction with the drift region, and a p-type junction barrier region on the silicon carbide layer. The p-type junction barrier region includes a p-type polysilicon region forming a P-N heterojunction with the drift region and the p-type junction barrier region is electrically connected to the contact.

The Schottky junction between the contact and the drift region may be configured to turn on at a lower forward voltage than the P-N heterojunction between the junction barrier region and the drift region.

The contact may form an ohmic contact to the p-type polysilicon region, and the P-N heterojunction between the heterojunction barrier region and the drift region may be configured to begin to conduct majority carriers at a higher forward voltage than a turn on voltage of the Schottky junction and at a lower voltage at which the P-N heterojunction between the heterojunction barrier region and the drift region begins to inject minority carriers into the drift region.

The electronic device may further include a guard ring termination region at a surface of the silicon carbide layer laterally adjacent to the contact. The guard ring termination region may include a second p-type polysilicon region on the drift region, the second p-type polysilicon region being electrically isolated from the contact under zero bias conditions.

The electronic device may further include a junction termination region at the surface of the silicon carbide layer having a conductivity type opposite the conductivity type of the drift region, the second p-type polysilicon region extends into the junction termination region.

The junction barrier region may include a plurality of p-type polysilicon regions in the drift region and at least one p-type polysilicon minority injector pad in the drift region beneath the contact and electrically connected to the contact.

The minority injector pad may have a surface area in a horizontal plane parallel to a major surface of the silicon carbide layer that is larger than a surface area in the horizontal plane of one of the plurality of p-type polysilicon regions in the junction barrier region.

The minority carrier injector pad may have a surface area in a horizontal plane parallel to a major surface of the silicon carbide layer that is at least about 10% of a surface area of the drift region in the horizontal plane below the contact.

The electronic device may further include an n+ silicon carbide contact layer on the drift region opposite the contact, and a second contact on the contact layer.

An electronic device according to further embodiments includes a drift region having a first conductivity type, a contact forming a junction with the drift region, and a junction barrier region on the drift region, the junction barrier region having a second conductivity type opposite the first conductivity type and including a heterojunction barrier region on the drift region. The heterojunction barrier region forms a P-N heterojunction with the drift region and is in electrical contact with the contact.

The Schottky junction between the contact and the drift region may be configured to turn on at a lower forward voltage than the P-N heterojunction between the heterojunction barrier region and the drift region.

The contact may form an ohmic contact to the heterojunction barrier region, and the P-N heterojunction between the heterojunction barrier region and the drift region may be configured to begin to conduct majority carriers at a higher forward voltage than a turn on voltage of the Schottky junction and at a lower voltage at which the P-N heterojunction between the heterojunction barrier region and the drift region begins to inject minority carriers into the drift region.

The electronic device may further include a guard ring termination region on the drift region and laterally adjacent to the Schottky junction. The guard ring termination region may include a second heterojunction barrier region.

The heterojunction barrier region may include a plurality of p-type polysilicon regions on the drift region and at least one p-type polysilicon minority injector pad on the drift region beneath the contact and electrically connected to the contact.

The minority carrier injection pad may have a width that is greater than a width of the junction barrier region.

The minority injector pad may have a horizontal surface area that is larger than a horizontal surface area of one of the plurality of p-type polysilicon regions in the junction barrier region.

The drift region may include n-type silicon carbide and the heterojunction barrier region may include p-type polysilicon. In some embodiments, the drift region may include n-type silicon carbide and the heterojunction barrier region may include p-type gallium nitride.

Some embodiments include a termination region at a surface of the drift region and defining an active region of the device within the termination region, wherein a ratio of a surface area of the active region occupied by the heterojunction barrier regions to a total surface area of the active region is about 2% to about 40%. In some embodiments, the ratio is about 4% to about 30%. In some other embodiments, the ratio is about 10% to about 30%, and in further embodiments the ratio is about 20% to about 30%.

Methods of forming an electronic device according to some embodiments include providing a drift region having a first conductivity type, providing a heterojunction barrier region on the drift region, the heterojunction barrier region including a material different from the drift region and having a conductivity type opposite the conductivity type of the drift region and providing a P-N heterojunction with the drift region, and forming a contact on the drift region and on the heterojunction barrier region, the contact forming a Schottky junction with the drift region and forming an ohmic junction with the heterojunction barrier region.

The drift region may include n-type silicon carbide and the heterojunction barrier region may include p-type polysilicon.

The methods may further include providing a guard ring termination region on the drift region laterally adjacent to the Schottky junction, the guard ring termination region may include a second heterojunction barrier region on the drift region.

Providing the heterojunction barrier region may include etching a recess in the drift region, depositing a polysilicon layer in the recess, doping the polysilicon layer to have a conductivity type opposite the conductivity type of the drift region, and patterning the polysilicon layer.

An electronic device according to further embodiments includes a silicon carbide layer including a drift region having a first conductivity type, a contact on a surface of the drift region and forming a Schottky junction with the drift region, and a guard ring in contact with the surface of the silicon carbide layer adjacent to the Schottky junction. The guard ring has a conductivity type opposite the conductivity type of the drift region and includes a material that forms a heterojunction with the silicon carbide layer. The guard ring may include polysilicon and/or gallium nitride.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
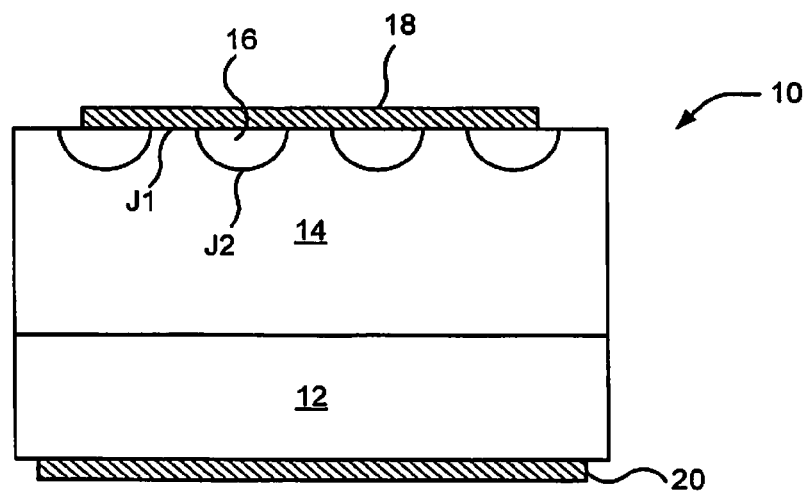
FIG. 1 is a cross-sectional view of a conventional JBS diode.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

According to some embodiments, a junction barrier Schottky diode includes features, such as junction barrier regions and/or edge termination features, on or in a drift layer, wherein the junction barrier regions and/or edge termination features are provided by regions of a different material type than the drift layer, and form respective heterojunctions with the drift layer. In some embodiments, the features, such as junction barrier regions and/or edge termination features, may include doped polysilicon, which can be formed, for example, using conventional processes that may not require ion implantation.

Figure 2:
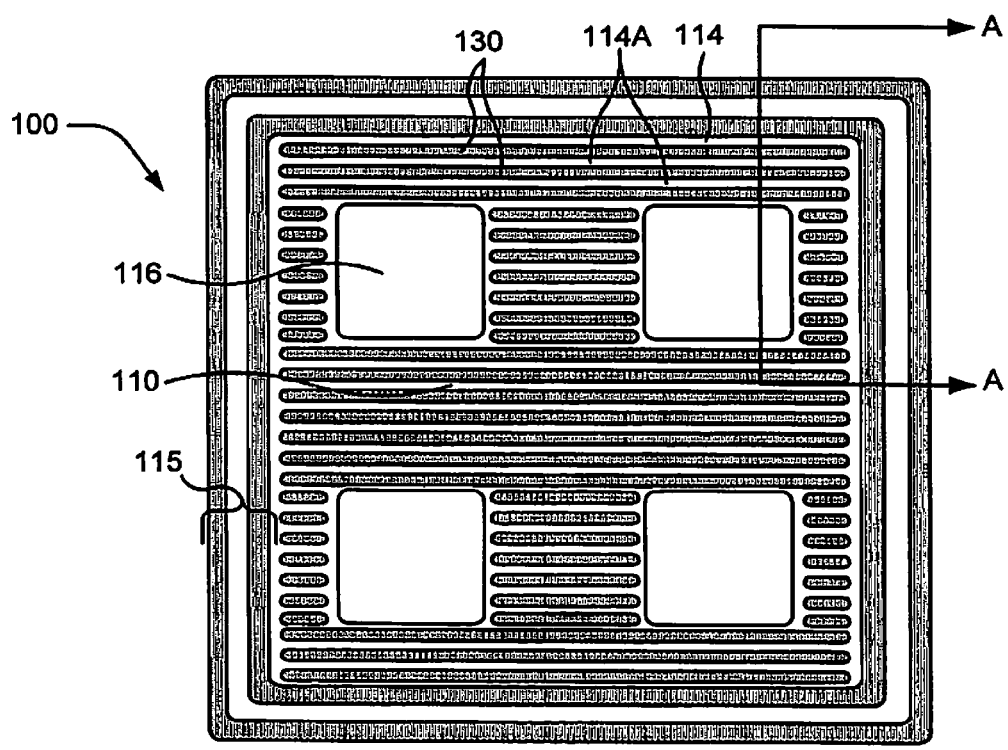
FIG. 2 is a top view of a JBS diode according to some embodiments of the present invention.
Figure 3:
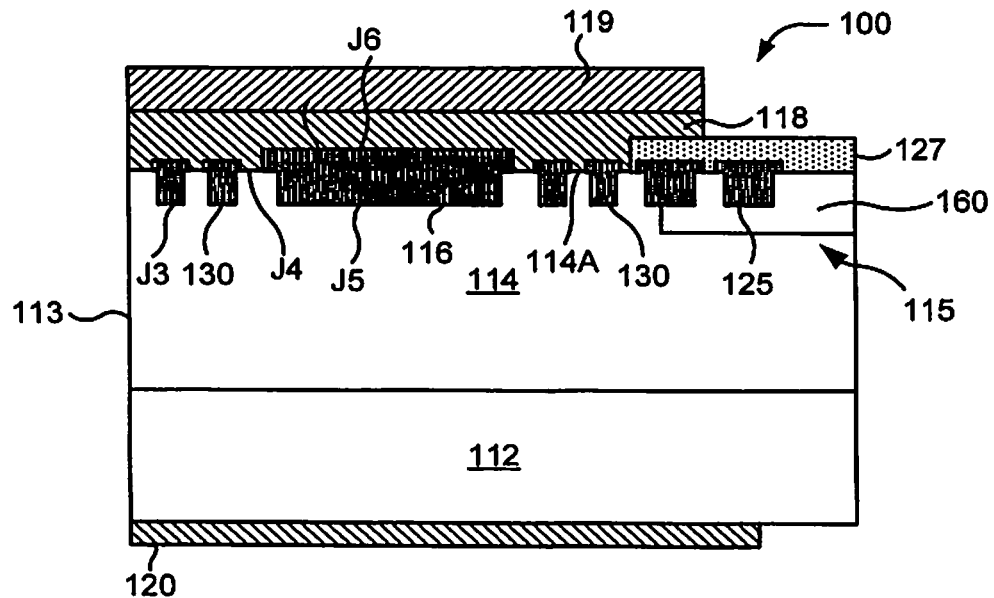
FIGS. 3, 4 and 5 are cross-sectional views of JBS diodes according to some embodiments of the present invention.
Figure 4:
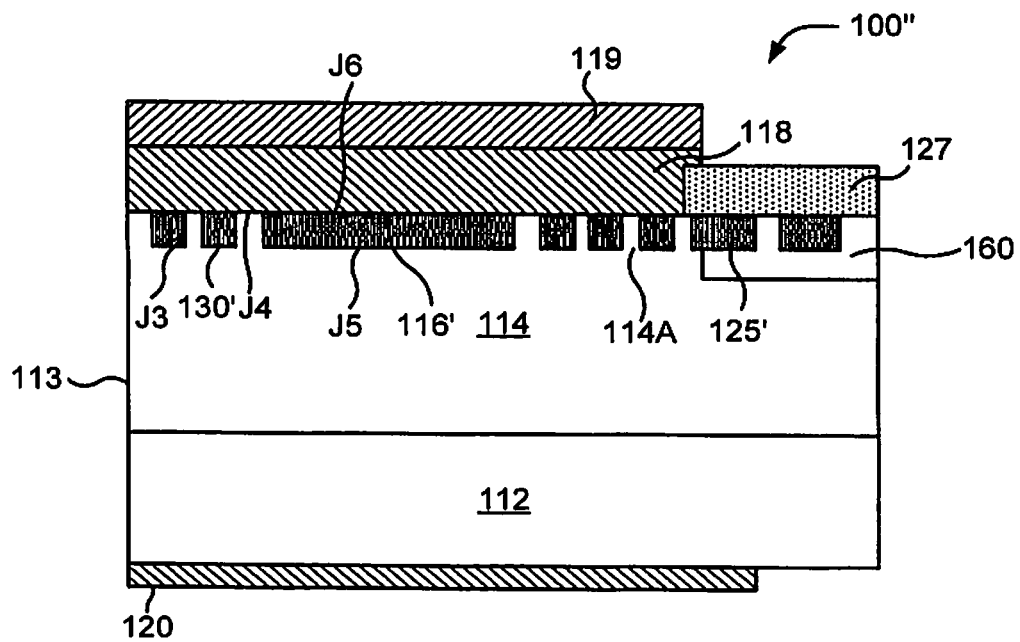
Figure 5:
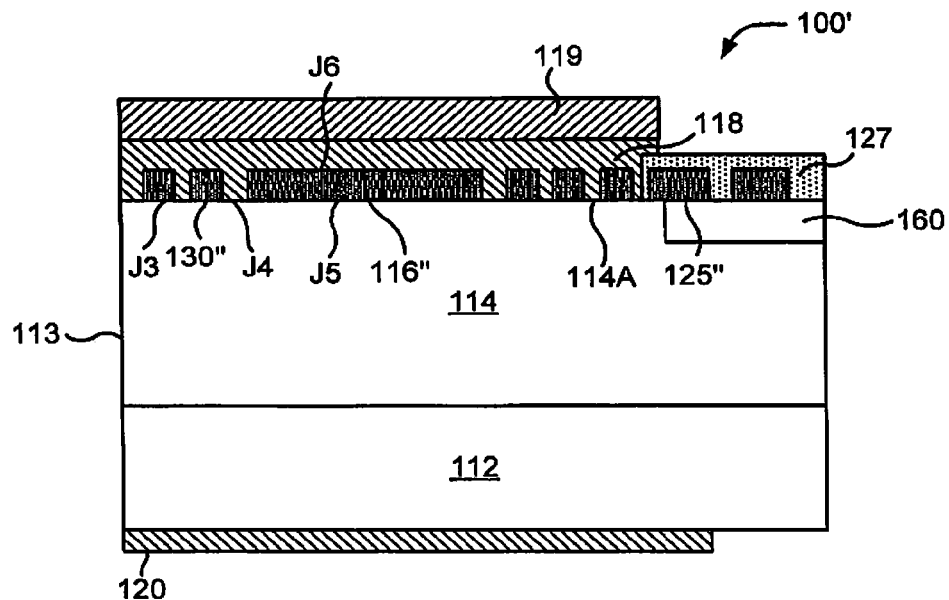

FIG. 2 is a top view of a diode 100 according to some embodiments of the invention, and FIG. 3 is a partial cross-sectional view of the diode 100 taken along line A-A of FIG. 2. FIGS. 4 and 5 are similar cross sectional illustrations of diodes 100' and 100", respectively, according to other embodiments. The dimensions of some features of the diodes 100, 100', 100" are exaggerated for clarity.

Referring to FIGS. 2 and 3, the diode 100 includes an optional substrate 112 on which a layer 113 including a drift region 114 is formed. The layer 113 has an upper surface, opposite the substrate, in which a plurality of heterojunction barrier regions 130 are formed. A Schottky contact 118 is on the drift region 114. The Schottky contact 118 contacts the surface of the drift region 114 and forms a Schottky junction with the drift region 114. The Schottky contact 118 also contacts the plurality of heterojunction barrier regions 130.

The layer 113 may be formed, for example, from n-type silicon carbide of the 2H, 4H, 6H, 3C and/or 15R polytype. The drift region 114 may have a dopant concentration of about $2\times10^{14}$ to about $1\times10^{17}$ cm$^{-3}$, depending on design requirements for voltage blocking and on-resistance for the diode 100. Other types of semiconductor materials, such as GaN, GaAs, silicon or germanium may be used. In particular embodiments, the drift region 114 includes 4H—SiC doped with n-type dopants at a concentration of about $5\times10^{15}$ cm$^{-3}$.

The heterojunction barrier regions 130 are formed from a semiconducting material that is different from the material of the drift region 114. The heterojunction barrier regions 130 have a conductivity type that is opposite the conductivity type of the drift region 114. Accordingly, the heterojunction barrier regions 130 form P-N heterojunctions with the drift region 114. Furthermore, the Schottky contact 118 may form an ohmic junction with the heterojunction barrier regions 130.

In some embodiments, the barrier height of the P-N heterojunction J3 between the heterojunction barrier regions 130 and the drift layer may be higher than a barrier height of a Schottky junction J4 between a Schottky contact 118 and the drift region 114, so that the P-N heterojunction will turn on at a higher forward voltage than the Schottky junction J4 between the drift region 114 and the Schottky contact 118, as will be discussed in more detail below.

In the embodiments of FIGS. 2 and 3, the heterojunction barrier regions 130 are formed as stripe-shaped regions in the drift region 114. However, the heterojunction barrier regions 130 may be formed in other shapes, such as islands, squares, dots, hexagons, or any other desired shape.

In some embodiments, the heterojunction barrier regions 130 may be provided as regions of doped polysilicon. For example, the heterojunction barrier regions 130 may include polysilicon regions doped to have a conductivity that is opposite the conductivity type of the drift region 114, so that the heterojunction barrier regions 130 form P-N heterojunctions J3 with the drift region 114.

The heterojunction barrier regions 130 may be doped with p-type dopants, such as boron and/or aluminum, at a concentration of about $1\times10^{17}$ to about $1\times10^{20}$ cm$^{-3}$, and may extend to a depth of about 0.3 to about 0.5 μm into the drift region 114 from the surface of the drift region 114. In particular embodiments, the heterojunction barrier regions 130 may be doped at a dopant concentration of about $5\times10^{18}$ cm$^{-3}$, and may extend to a depth of about 0.3 μm into the drift region 114 from the surface of the drift region 114.

One or more current surge pads 116 may also be provided in the drift region 114. The current surge pads 116 may be formed of the same material as the heterojunction barrier regions 130. For example, the current surge pads 116 may be provided as polysilicon regions doped with p-type dopants, such as boron and/or aluminum, at a concentration of about $1\times10^{18}$ to about $1\times10^{20}$ cm$^{-3}$, and may extend to a depth of about 0.3 to about 0.5 μm into the drift region 114. In particular embodiments, the current surge pads 116 may be doped at a dopant concentration of about $5\times10^{18}$ cm$^{-3}$, and may extend to a depth of about 0.3 μm into the drift region 114. The current surge pads 116 have a larger width than the heterojunction barrier regions 130 to encourage the flow of surge current through the current surge pads at high forward voltages, as will be discussed in more detail below. For example, the current surge pads 116 may have a width of about 10 μm to about 250 μm. In particular embodiments, the current surge pads 116 may have a width of about 20 μm.

In some embodiments, the current surge pads 116 and/or heterojunction barrier regions 130 may be formed of other types of materials that can be doped to have a conductivity that is opposite the conductivity of the drift region 114 and can form a heterojunction with the drift region 114. For example, when the drift region comprises n-type silicon carbide, a material such as p-type gallium nitride can be used to form the current surge pads 116 and/or heterojunction barrier regions 130.

The heterojunction barrier regions 130 shown in the embodiments of FIGS. 2 and 3 are provided as spaced apart striped regions that expose portions 114A of the surface of the drift region 114 and that extend across an active region 110 of the drift region 114 (except for the exposed portions 114A of the drift layer and the current surge pads 116). A metal Schottky contact 118 covers the drift region 114 and forms Schottky rectifying junctions with the exposed portions 114A of the drift region 114 as well as the heterojunction barrier regions 130 and the current surge pads 116.

As used herein, the term "active region" refers to the two dimensional area of the device in which the Schottky metal contacts the drift layer, and includes the exposed portions 114A of the drift region 114, the heterojunction barrier 130 and the current surge pads 116. Accordingly, the active region includes the Schottky junction area but does not include, for example, the edge termination region described below.

The diode 100 may include an edge termination region 115 surrounding the active region 110 of the diode 100. The edge termination region 115 may include a junction termination extension (JTE) region, field rings, field plates, guard rings, and/or a combination of the foregoing or other terminations. In particular, the device 100 may include a plurality of guard rings 125, which may be formed of the same material as the heterojunction barrier regions 130 and the current surge pad 116 and may also be doped to have a conductivity opposite the conductivity type of the drift region 114. A passivation layer, such as a field oxide layer 127, may be formed on the drift layer and may cover the guard rings 125. The guard rings 125 may be floating guard rings that are electrically isolated from the anode contact 118 under zero bias conditions.

In some embodiments, the edge termination region 115 includes a robust guard ring (RGR) termination as described in U.S. Pat. No. 7,026,650, which is assigned to the assignee of the present invention, the disclosure of which is incorporated herein by reference as if set forth fully. In particular, the RGR termination may include an implanted region 160 of dopants having a conductivity opposite the conductivity of the drift layer. The implanted region 160 may extend to a depth in the drift region 114 that is greater or less than the depth of the guard rings 125. The implanted region 160 may have a net concentration of dopants having a conductivity opposite the conductivity type of the drift region 114 of about $1\times10^{17}$ cm$^{-3}$.

Additional conventional terminations of SiC Schottky diodes are described in "Planar Terminations in 4H—SiC Schottky Diodes With Low Leakage And High Yields" by Singh et al., ISPSD '97, pp. 157 160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331 332. Additionally, other termination techniques are described in published PCT Application No. WO 97/08754 entitled "SiC Semiconductor Device Comprising A PN Junction With A Voltage Absorbing Edge."

The current surge pads 116 and the heterojunction barrier regions 130 may be formed within recesses in the drift region 114, and may protrude above an upper surface of the drift region 114. As the current surge pads 116 and the heterojunction barrier regions 130 have an opposite conductivity type from the drift region 114, the heterojunction barrier regions 130 form P-N junctions J3 with the drift region 114, while the current surge pads 116 form P-N junctions J5 with the drift region 114.

In the diode 100' illustrated in FIG. 4, the current surge pads 116', the heterojunction barrier regions 130' and the guard rings 125' are formed within recesses in the drift region 114, and are flush with the upper surface of the drift region 114. For example, polysilicon may be deposited into the recesses in the drift region 114 and planarized using a chemical-mechanical polish (CMP) or etch back technique to form the current surge pads 116', the heterojunction barrier regions 130', and/or the guard rings 125', as shown in FIG. 4.

In the diode 100" illustrated in FIG. 5, the current surge pads 116", the heterojunction barrier regions 130" and the guard rings 125" are formed as discrete regions on the upper surface of the drift region 114, and do not extend into the drift region 114. For example, For example, polysilicon may be deposited onto the drift region 114 and patterned using photolithography to form the current surge pads 116", the heterojunction barrier regions 130", and/or the guard rings 125", as shown in FIG. 5.

Referring again to FIG. 3, the ratio of the surface area of the active region 110 of the device 100 occupied by the heterojunction barrier regions 130 and the current surge pads 116 to the total surface area of the active region 110 may affect both the reverse leakage current of the device 100 and the forward voltage drop of the device 100. For example, if the area occupied by the heterojunction barrier regions 130 and the current surge pads 116 is increased relative to the total area of the active region 110, the reverse leakage current may be reduced, but the forward voltage drop of the device 100 may increase. Thus, the selection of the ratio of the surface area of the active region 110 of the device 100 occupied by the heterojunction barrier regions 130 and the current surge pads 116 to the total surface area of the active region 110 may entail a trade-off between reverse leakage current and forward voltage drop. In some embodiments, the ratio of the surface area of the active region 110 of the device 100 occupied by the heterojunction barrier regions 130 and the current surge pads 116 to the total surface area of the active region 110 may be between about 2% and 40%. In some other embodiments, the ratio of the surface area of the active region 110 of the device 100 occupied by the heterojunction barrier regions 130 and the current surge pads 116 to the total surface area of the active region 110 may be between about 4% and 30%. In further embodiments, the ratio may be about 10% to about 30%, and in still further embodiments, the ratio may be about 20% to about 30%.

The Schottky contact 118 on the surface of the drift region 114 forms a Schottky junction J4 with the exposed portions 114A of the drift region 114 between adjacent heterojunction barrier regions 130. The anode contact 118 may include a metal, such as aluminum, titanium and/or nickel. In some embodiments, the anode contact 118 may form an ohmic contact with the current surge pad 116. A metal overlayer 119 may be formed on the Schottky contact 118. The metal overlayer 119 may comprise TiW/Al, for example, and may be provided as a contact layer on the Schottky contact 118.

A cathode contact 120 is formed on a side of the substrate 112 opposite the drift region 114 and/or directly on the drift region 114. The cathode contact 120 may include a metal, such as nickel, that is capable of forming an ohmic contact to n-type silicon carbide.

Under reverse bias conditions, the depletion regions formed by the p-n junctions J3 between the heterojunction barrier regions 130 and the drift region 114, as well as the depletion region of the p-n junction J5, may expand to block reverse current through the device 100, protecting the Schottky junction J4 and limiting reverse leakage current in the device 100. Thus, in reverse bias, the diode 100 may function substantially like a PIN diode.

In forward operation, the Schottky junction J4 between the anode contact 118 and the exposed portions 114A of the drift region 114 turns on before the heterojunction J3 and the junction J5 between the current surge pad 116 and the drift region 114. Thus, at low forward voltages, the device exhibits Schottky diode behavior, and the operation of the diode 100 will be dominated by the injection of majority carriers across the Schottky junctions J3 and J4. Due to the absence of minority carrier injection under normal operating conditions, the diode 100 may have a very fast switching capability, which is characteristic of Schottky diodes in general.

The current surge pad 116 may be designed to begin to conduct at a forward voltage that is higher than the turn-on voltage of the Schottky junction J3. Thus, in the event of a current surge that causes the forward voltage of the diode 100 to increase, the p-n junction J5 will begin to conduct. Once the p-n junction J5 begins to conduct, the operation of the diode 100 is dominated by the injection and recombination of minority carriers across the p-n junction J5. In that case, the forward voltage drop of the diode 100 may be clamped, which may decrease the amount of power dissipated by the diode 100 for a given level of current. Thus, turn-on of the p-n junction J5 when the forward voltage of the diode 100 increases may reduce and/or prevent forward current runaway in the diode 100.

Furthermore, in a device according to some embodiments, the turn-on of the p-n junctions J3 and J5 may occur in stages. In a first stage, the Schottky junction J4 between the drift region 114 and the Schottky contact 118 may turn on, resulting in majority carrier conduction. In a second stage, as the bias on the P-N heterojunction J3 increases, majority carriers may be injected across the P-N heterojunction J3, allowing for further reduction in on-resistance. Furthermore, in a device according to some embodiments, the turn on of junction J5 may occur in stages, resulting in minority carrier injection allowing for surge current capability.

Figure 6:
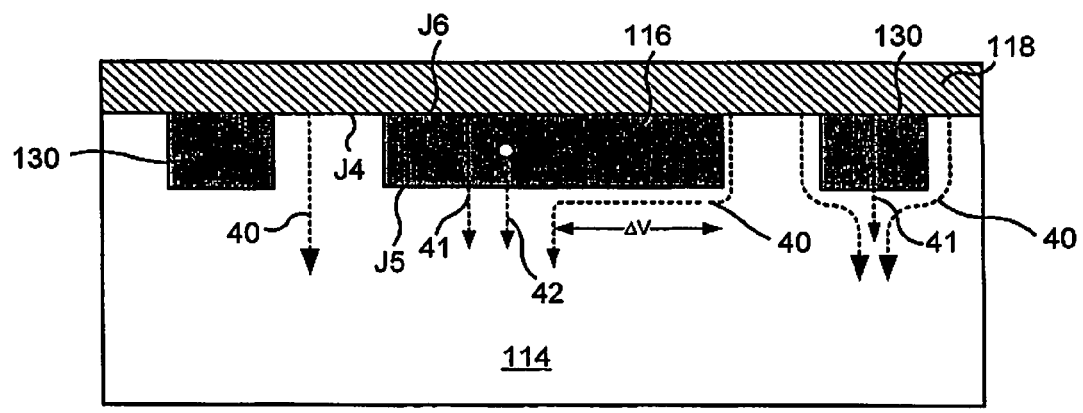
FIG. 6 is a cross-sectional detail of portions of a JBS diode according to some embodiments of the invention.
Figure 7:
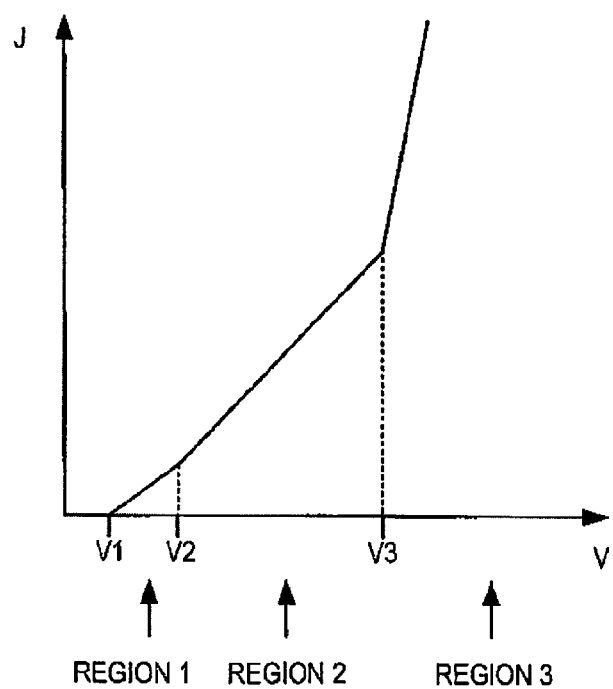
FIG. 7 is a graph that schematically illustrates various regions in a current-voltage characteristic of a JBS diode according to some embodiments of the invention.

Forward current operation of a device according to some embodiments is illustrated in FIGS. 6 and 7. In particular, FIG. 6 is a magnified illustration of a portion of a drift region 114 include a current surge pad 116 and two heterojunction barrier regions 130. Forward current components 40, 41 and 42 are illustrated in FIG. 6. FIG. 7 is a schematic graph of current density (J) versus forward voltage (V) for a Schottky diode according to some embodiments. As shown in FIG. 7, the current-voltage characteristic of a Schottky diode according to some embodiments may have three distinct regions of operation, shown in FIG. 7 as Region 1, Region 2 and Region 3.

Referring to FIG. 6, when a forward voltage is applied to the Schottky contact 118 relative to the drift region 114 that is sufficient to turn on the Schottky junction J4 between the Schottky contact 118 and the drift region 114, majority carriers (e.g., electrons in the case of an n-type drift layer) are injected into the drift layer, resulting in a Schottky current component 40. Before the P-N heterojunction J5 between the current surge pad 116 and the drift region 114 and the ohmic junction J6 between the anode contact 118 and the current surge pad 116 have turned on, the Schottky current component 40 is the only component of the device current. This is illustrated as Region 1 in the graph of FIG. 7, where the forward voltage of the device is between V1 and V2. V1 represents the turn-on voltage of the Schottky junction J4, while V2 represents the turn-on voltage of the heterojunction J3 between the heterojunction barrier region 130 and the drift region 114.

In particular embodiments, the turn-on voltage of the Schottky junction J4 may be about 0.8 V when the Schottky contact 118 is titanium and the drift region 114 is n-type silicon carbide, while the turn-on voltage of the junction J3 between the heterojunction barrier region 130 and the drift region 114 may be about 1.5 V.

As shown in FIG. 6, the Schottky current 40 spreads laterally beneath the current surge pad 116 and the heterojunction barrier regions 130, resulting in spreading resistance in the device. Thus, the current-voltage curve shown in FIG. 7 may have a relatively low slope in Region 1.

When the forward voltage of the device reaches V2, the heterojunction J3 between the heterojunction barrier region 130 and the drift region 114 and the heterojunction J5 between the current surge pad 116 and the drift region 114 may turn on, resulting in unipolar injection of electrons 41 into the drift region. The device may still exhibit some spreading resistance. However, the overall resistance of the device may decrease, resulting in a increased slope in Region 2 of the current-voltage curve shown in FIG. 7 relative to Region 1.

As the voltage on the device increases, the Schottky current through junction J4 increases. The voltage drop ΔV across the current surge pad 116 also increases to the point where the P-N heterojunction J5 between the current surge pad 116 and the drift region 114 begins to inject minority carriers 42 (e.g., holes in the case of an n-type drift layer) into the drift region 114. This condition is illustrated as Region 3 of FIG. 7. The resistance of the device is further reduced, increasing the slope of the current-voltage curve in Region 3.

It will be appreciated that the voltage drop ΔV across the half-width of the current surge pad 116, which is greater than the half-width of the heterojunction barrier regions 130, where "half-width" refers to the minimum lateral distance from an edge of the feature to a center of the feature, i.e., the minimum distance that laterally spreading current must travel to reach the center point of the feature. As the width of the current surge pad 116 is greater than the widths of the heterojunction barrier regions 130, the junction J5 between the current surge pad 116 and the drift layer will tend to turn on before the junctions between the heterojunction barrier regions 130 and the drift region 114.

Figure 8:
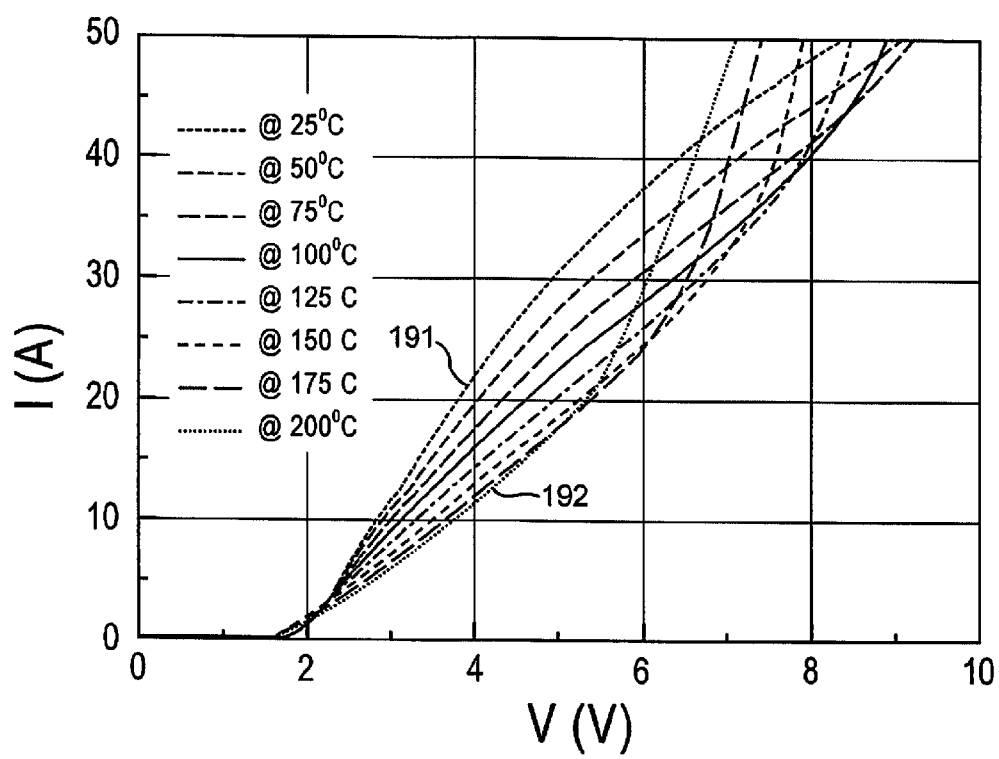
FIG. 8 is a graph illustrating simulated forward current-voltage curves at operating temperatures ranging from 25° C. to 200° C. for a device according to some embodiments.

Empirical forward current-voltage curves at operating temperatures ranging from 25° C. to 200° C. for a device according to some embodiments with p+ polysilicon as the Schottky contact are illustrated in FIG. 8. For example, a current-voltage curve according to some embodiments at 25° C. is illustrated as curve 191, while to a current-voltage curve according to some embodiments at 200° C. is illustrated as curve 192. These curves indicate that surge capability of diodes according to some embodiments is enhanced at high temperature, as the slope of the curves increases with temperature and forward voltage. The device illustrated in FIG. 8 starts conducting at about 1.8 V instead of the Ti—SiC Schottky turn-on voltage of 0.8V because polysilicon was used as the anode contact 118.

Figure 9:
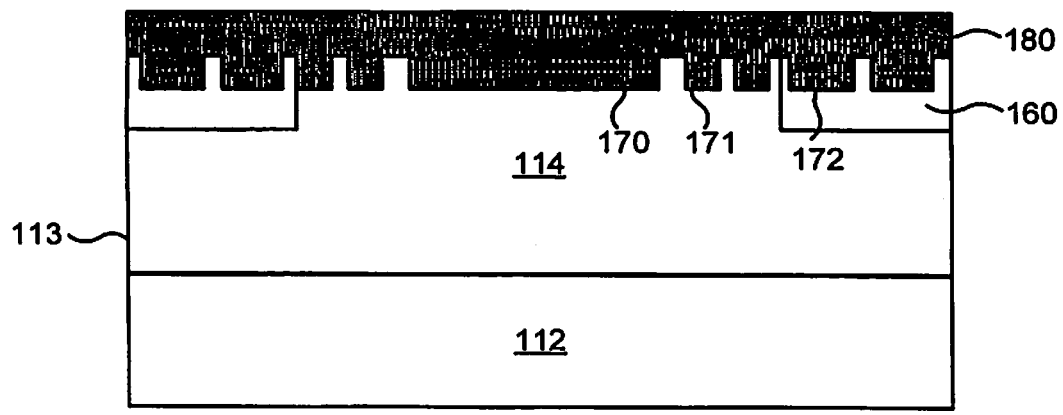
FIGS. 9-12 are cross-sectional views illustrating the formation of JBS diodes according to some embodiments of the present invention.

FIGS. 9-12 illustrate methods of forming devices according to some embodiments. Referring to FIG. 9, a drift region 114 is provided. The drift region 114 may be provided on a substrate 112. However, it will be appreciated that the substrate 112 is optional and may be removed or omitted in some embodiments.

The drift region 114 may be formed, for example, from n-type silicon carbide of the 2H, 4H, 6H, 3C and/or 15R polytype having a dopant concentration of about $2 \times 10^{14}$ to about $1 \times 10^{17}$ cm$^{-3}$, depending on design requirements for voltage blocking and on-resistance for the diode 100. Other types of semiconductor materials, such as GaN, GaAs, silicon or germanium may be used. In particular embodiments, the drift region 114 includes 4H—SiC doped with n-type dopants at a concentration of about $5 \times 10^{15}$ cm$^{-3}$.

Optional implanted regions 160 may be formed at the device periphery to provide a robust guard ring termination.

A plurality of recesses 170, 171 and 172 are formed in a surface of a drift region 114, for example by masking and etching techniques which are well known in the art. The recesses 170, 171 and 172 may extend to a depth of about 0.3 to about 0.5 μm into the drift region 114 from the surface of the drift region 114. A layer of a material 180, such as polysilicon, which forms a heterojunction with the drift layer, is deposited on the surface of the drift layer and into the recesses 170, 171, 172. The layer 180 of polysilicon may be doped with p-type dopants, such as boron and/or aluminum, at a concentration of about $1 \times 10^{18}$ to about $1 \times 10^{19}$ cm$^{-3}$, and in particular embodiments at a dopant concentration of about $5 \times 10^{18}$ cm$^{-3}$. The layer 180 of polysilicon may be doped using any conventional doping technique, such as in-situ doping, spinning-on, diffusion and drive-in annealing, etc.

Figure 10:
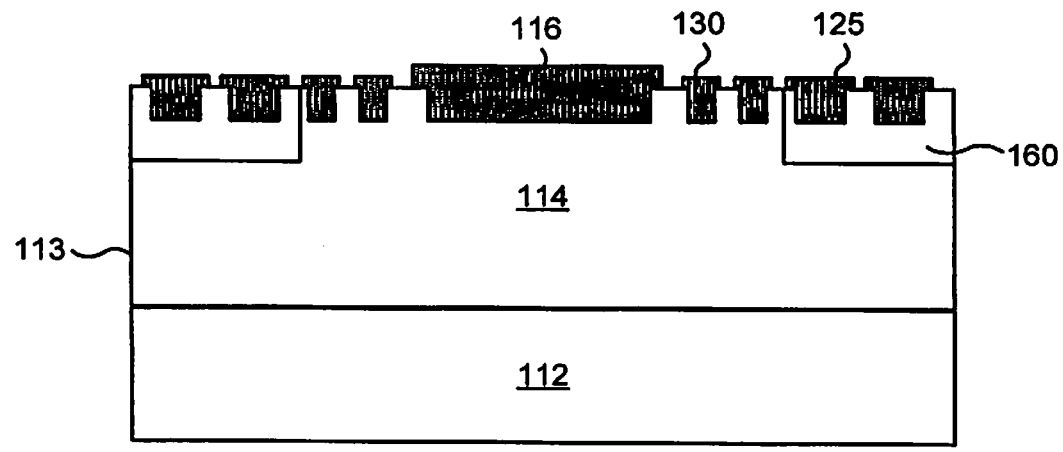
Figure 11:
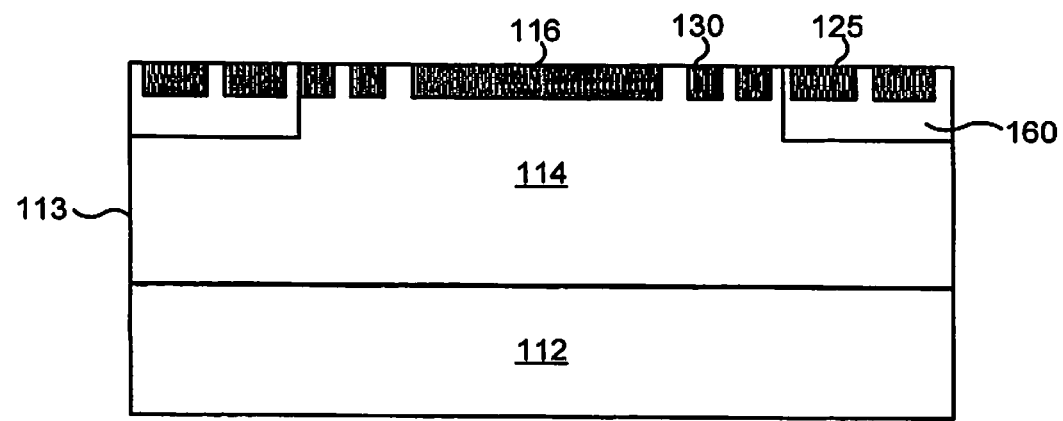

The layer 180 may be patterned using photolithographic techniques to form respective current surge pads 116, heterojunction barrier regions 130 and/or guard rings 125 that protrude above the surface of the drift region 114 (FIG. 10). In some embodiments, the layer 180 may be planarized using chemical-mechanical polish and/or etchback techniques to form respective current surge pads 116, heterojunction barrier regions 130 and guard rings 125 that are flush with the surface of the drift region 114 (FIG. 11).

Figure 12:
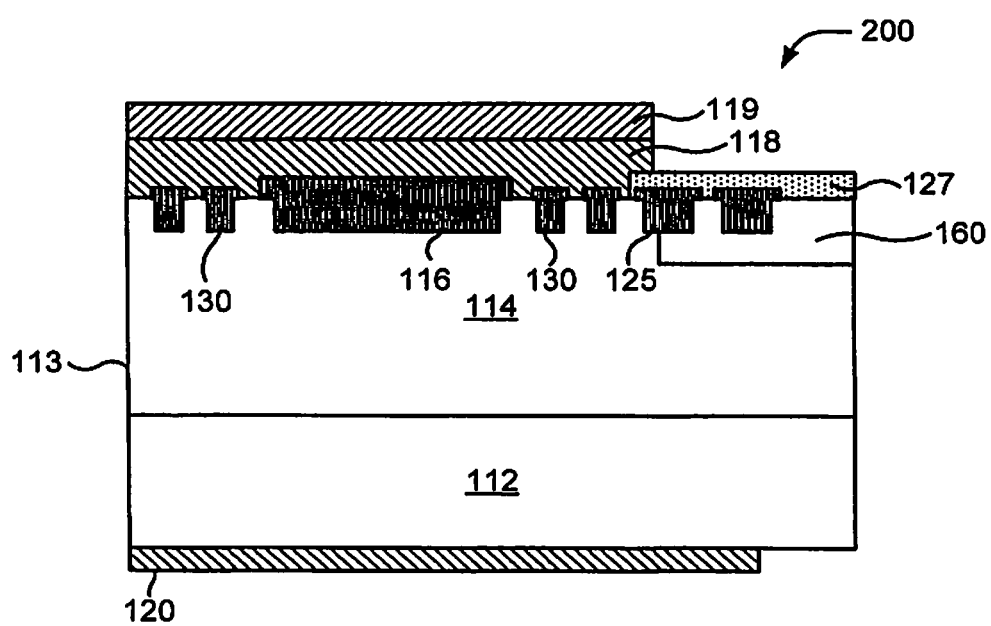

Referring to FIG. 12, a Schottky contact 118 may be formed on the drive region 114 and may include a metal, such as aluminum, titanium and/or nickel. In some embodiments, the contact 118 may form an ohmic contact with the current surge pad 116 and a Schottky contact with the drift region 114. A metal overlayer 119 may be formed on the Schottky contact 118. The metal overlayer 119 may comprise TiW/Al, for example, and may be provided as a contact layer on the Schottky contact 118.

A cathode contact 120 is formed on a side of the substrate 112 opposite the drift region 114. The cathode contact 120 may include a metal, such as nickel, that is capable of forming an ohmic contact to n-type silicon carbide.

An implanted region 160 of dopants having a conductivity opposite the conductivity of the drift layer may be formed beneath the guard rings 125 to probed a robust guard ring (RGR) termination. The implanted region 160 may extend to a depth in the drift layer that is greater or less than the depth of the guard rings, and may have a net concentration of dopants having a conductivity opposite the conductivity type of the drift region 114 of about $1 \times 10^{17}$ cm$^{-3}$. Finally, a field oxide layer 127 may be formed on the drift layer and may cover the guard rings 125.

Figure 13A:
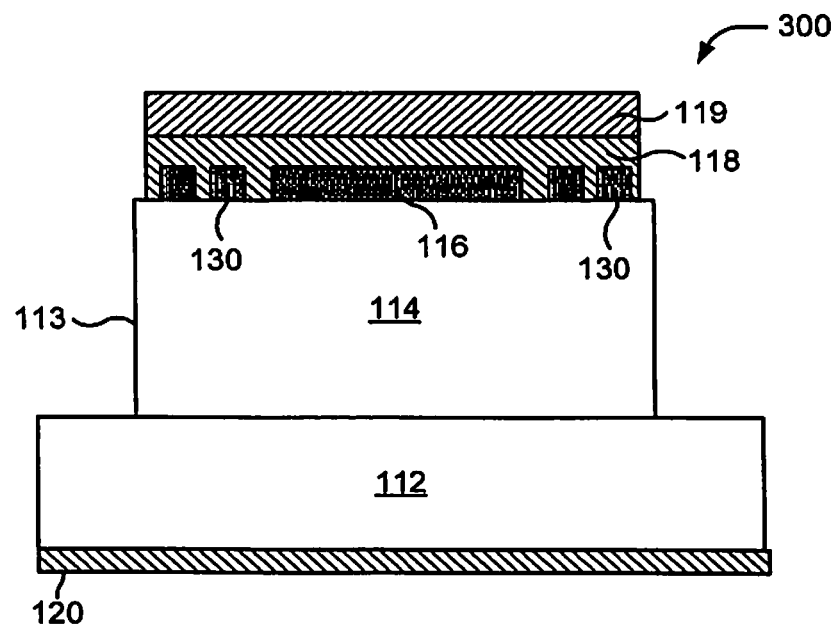
FIGS. 13A and 13B are cross-sectional views of JBS diodes according to some embodiments of the present invention.
Figure 13B:
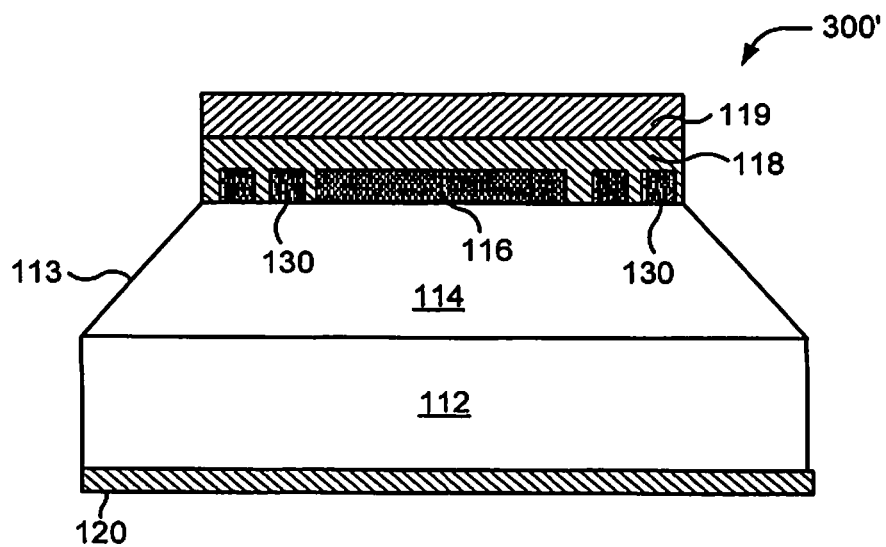

Further embodiments are illustrated in FIGS. 13A and 13B, which are a cross-sectional views of devices 300 and 300', respectively, that have a mesa termination (FIG. 13A) and a beveled edge termination (FIG. 13B), as opposed to guard ring termination.

Figure 14:
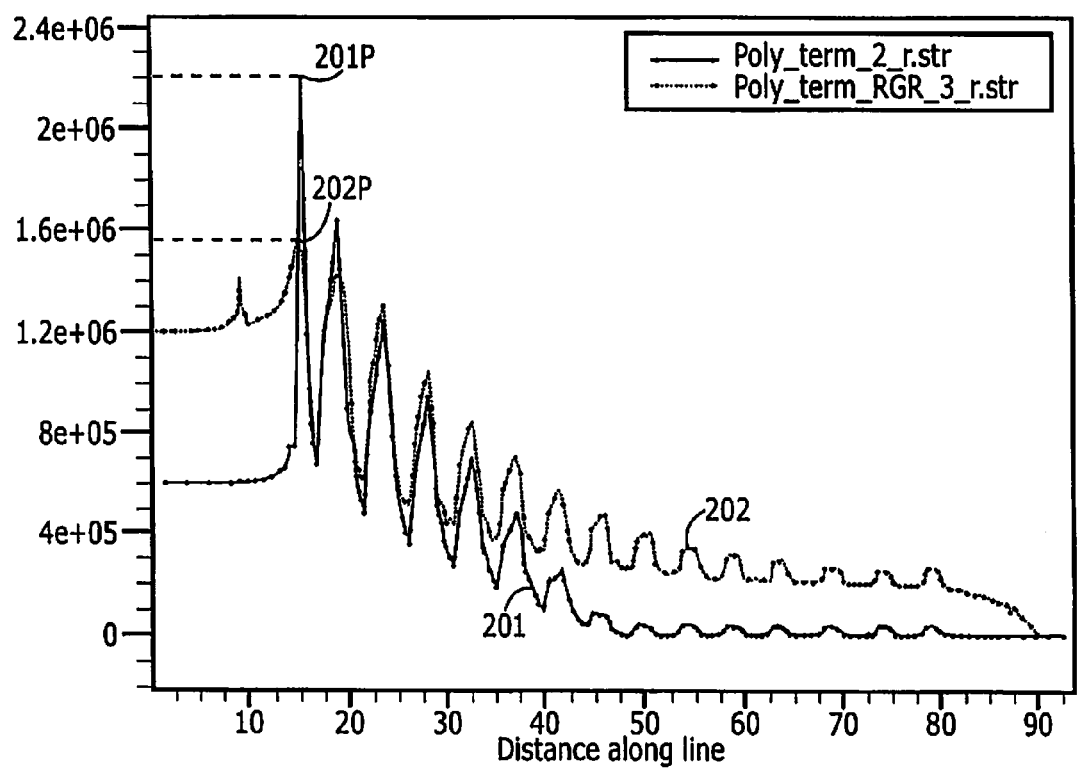
FIG. 14 is a graph illustrating simulated horizontal electric field distributions for a device according to some embodiments.

FIG. 14 is a graph illustrating simulated horizontal electric field distributions for a device according to some embodiments including heterojunction barrier regions and a heterojunction guard ring termination (curve 201) and a device according to some embodiments including heterojunction barrier regions and a heterojunction guard ring termination with a robust guard ring termination including implanted regions 160 (curve 202). As can be seen in FIG. 14, a peak electric field 201P for the device represented by curve 201 may be substantially higher than a peak electric field 202P for the device represented by curve 202.

Embodiments of the present invention provide junction barrier Schottky semiconductor devices that may require no, or fewer, implantation steps compared to conventional JBS devices. Thus, cost and/or complexity of fabrication of such devices can be reduced. Furthermore, some embodiments use doped polysilicon features in a JBS diode. Polysilicon can be doped in many conventional techniques, and polysilicon processing techniques are compatible with high throughput processing. Furthermore, p-type polysilicon can act as a minority injector in surge current conditions in some embodiments, and the surge capability may be further enhanced at high temperature operation.

While embodiments of the present invention have been described with reference to particular sequences of operations, as will be appreciated by those of skill in the art, certain operations within the sequence may be reordered while still benefiting from the teachings of the present invention. Accordingly, the present invention should not be construed as limited to the exact sequence of operations described herein.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A Schottky diode comprising:
a drift layer having a first surface associated with an active region and an edge termination region substantially laterally adjacent the active region, wherein the drift layer comprises silicon carbide and is doped with a doping material of a first conductivity type and the edge termination region has an edge termination recess extending into the drift layer from the first surface;
a Schottky layer over the active region of the first surface to form a Schottky junction;
an edge termination structure formed in a bottom surface of the edge termination recess, wherein the edge termination structure comprises:
a first guard ring; and
a second guard ring;
an array of junction barrier elements formed below the Schottky junction and in the drift layer; and
an implanted region, wherein one of the first and second guard rings is only partially disposed within the implanted region and the other of the first and second guard rings is completely disposed within the implanted region.

2. The Schottky diode of claim 1 wherein the first surface of the drift layer comprises a plurality of junction barrier element recesses in the active region such that at least certain junction barrier elements of the array of junction barrier elements are doped regions that extend into the drift layer about corresponding ones of the plurality of junction barrier element recesses, and the doped regions are doped with a doping material of a second conductivity type, which is opposite the first conductivity type.

3. The Schottky diode of claim 1 wherein the edge termination recess extends substantially about the active region.

4. The Schottky diode of claim 1 wherein the Schottky layer is formed from a low barrier height capable metal that comprises at least one of a group consisting of titanium, chromium, and aluminum.

5. The Schottky diode of claim 1 wherein each junction barrier element of the array of junction barrier elements is substantially the same as others of the array of junction barrier elements.

6. The Schottky diode of claim 1 wherein at least a first junction barrier element of the array of junction barrier elements is substantially different in size or shape than at least a second junction barrier element of the array of junction barrier elements.

7. The Schottky diode of claim 1 wherein at least certain junction barrier elements in the array of junction barrier elements are elongated stripes.

8. The Schottky diode of claim 1 wherein at least certain junction barrier elements in the array of junction barrier elements are substantially around the first surface.

* * * * *